(12) United States Patent
Leong et al.

(10) Patent No.: US 10,134,539 B2
(45) Date of Patent: *Nov. 20, 2018

(54) VENTING SYSTEM AND SHIELD FOR KEYBOARD

(71) Applicant: Apple Inc., Cupertino, CA (US)

(72) Inventors: Craig C. Leong, Cupertino, CA (US); Bradford J. Zercoe, Cupertino, CA (US); Thai Quoc La, Cupertino, CA (US); Nicholas I Reid, Cupertino, CA (US); Keith J. Hendren, San Francisco, CA (US); John M. Brock, Menlo Park, CA (US); Matthew W. Blum, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/867,712

(22) Filed: Sep. 28, 2015

(65) Prior Publication Data

US 2016/0189890 A1 Jun. 30, 2016

Related U.S. Application Data

(60) Provisional application No. 62/058,087, filed on Sep. 30, 2014, provisional application No. 62/129,842, (Continued)

(51) Int. Cl.
*H01H 13/06* (2006.01)
*H01H 13/02* (2006.01)
(Continued)

(52) U.S. Cl.
CPC .......... *H01H 13/06* (2013.01); *G06F 1/1662* (2013.01); *G06F 3/0202* (2013.01); *H01H 3/125* (2013.01);
(Continued)

(58) Field of Classification Search
CPC .. H01H 13/82; H01H 9/342; H01H 2213/002; H01H 13/702; H01H 1/021;
(Continued)

(56) References Cited

U.S. PATENT DOCUMENTS

| | | |
|---|---|---|
| 3,657,492 A | 4/1972 | Arndt et al. |
| 3,917,917 A | 11/1975 | Murata |

(Continued)

FOREIGN PATENT DOCUMENTS

| | | |
|---|---|---|
| CN | 2155620 | 2/1994 |
| CN | 2394309 | 8/2000 |

(Continued)

OTHER PUBLICATIONS

U.S. Appl. No. 14/472,260, filed Aug. 28, 2014, pending.

(Continued)

*Primary Examiner* — Ahmed Saeed
(74) *Attorney, Agent, or Firm* — Dorsey & Whitney LLP

(57) ABSTRACT

A venting system for a keyboard assembly is disclosed. A keyboard assembly including a printed circuit board defining a set of apertures, and a group of switch housings coupled to the printed circuit board. Each switch housing of the group of switch housings may define a switch opening positioned above one of the set of apertures of the printed circuit board. The keyboard assembly may also include a shield defining at least one channel of a venting system formed below the printed circuit board. The at least one channel may be in fluid communication with at least one aperture, and at least one of the switch openings positioned above the at least one aperture.

26 Claims, 11 Drawing Sheets

Related U.S. Application Data filed on Mar. 7, 2015, provisional application No. 62/058,067, filed on Sep. 30, 2014, provisional application No. 62/129,840, filed on Mar. 7, 2015, provisional application No. 62/058,074, filed on Sep. 30, 2014, provisional application No. 62/129,841, filed on Mar. 7, 2015, provisional application No. 62/058,081, filed on Sep. 30, 2014, provisional application No. 62/129,843, filed on Mar. 7, 2015.

(51) Int. Cl.
| | | |
|---|---|---|
| *H01L 33/50* | (2010.01) | |
| *H01H 13/70* | (2006.01) | |
| *G06F 1/16* | (2006.01) | |
| *G06F 3/02* | (2006.01) | |
| *H01H 3/12* | (2006.01) | |
| *H01H 13/79* | (2006.01) | |
| *H01H 13/80* | (2006.01) | |
| *H01H 13/803* | (2006.01) | |
| *H01H 13/83* | (2006.01) | |
| *H01H 13/86* | (2006.01) | |
| *H01H 13/04* | (2006.01) | |

(52) U.S. Cl.
CPC ......... *H01H 13/023* (2013.01); *H01H 13/04* (2013.01); *H01H 13/70* (2013.01); *H01H 13/7006* (2013.01); *H01H 13/79* (2013.01); *H01H 13/80* (2013.01); *H01H 13/803* (2013.01); *H01H 13/83* (2013.01); *H01H 13/86* (2013.01); *H01L 33/50* (2013.01); *H01H 2203/004* (2013.01); *H01H 2203/038* (2013.01); *H01H 2203/056* (2013.01); *H01H 2205/016* (2013.01); *H01H 2205/024* (2013.01); *H01H 2207/04* (2013.01); *H01H 2211/028* (2013.01); *H01H 2213/01* (2013.01); *H01H 2213/016* (2013.01); *H01H 2215/038* (2013.01); *H01H 2219/036* (2013.01); *H01H 2219/052* (2013.01); *H01H 2219/06* (2013.01); *H01H 2219/062* (2013.01); *H01H 2221/076* (2013.01); *H01H 2227/026* (2013.01); *H01H 2229/046* (2013.01); *H01H 2239/004* (2013.01)

(58) Field of Classification Search
CPC .. H01H 13/06; H01H 13/70; H01H 2009/048; H01H 2223/004
USPC ..... 200/305, 5 A, 515, 306, 304, 61 A, 512, 200/266, 262, 35 A, 341–345, 5
See application file for complete search history.

(56) References Cited

U.S. PATENT DOCUMENTS

| | | |
|---|---|---|
| 3,978,297 A | 8/1976 | Lynn et al. |
| 4,095,066 A | 6/1978 | Harris |
| 4,319,099 A | 3/1982 | Asher |
| 4,349,712 A | 9/1982 | Michalski |
| 4,484,042 A | 11/1984 | Matsui |
| 4,596,905 A | 6/1986 | Fowler |
| 4,670,084 A | 6/1987 | Durand et al. |
| 4,755,645 A | 7/1988 | Naoki et al. |
| 4,937,408 A | 6/1990 | Hattori et al. |
| 4,987,275 A | 1/1991 | Miller et al. |
| 5,021,638 A | 6/1991 | Nopper et al. |
| 5,092,459 A | 3/1992 | Uljanic et al. |
| 5,136,131 A | 8/1992 | Komaki |
| 5,278,372 A | 1/1994 | Takagi et al. |
| 5,280,146 A | 1/1994 | Inagaki et al. |
| 5,340,955 A | 8/1994 | Calvillo et al. |
| 5,382,762 A | 1/1995 | Mochizuki |
| 5,397,867 A | 3/1995 | Demeo |
| 5,408,060 A | 4/1995 | Muurinen |
| 5,421,659 A | 6/1995 | Liang |
| 5,422,447 A | 6/1995 | Spence |
| 5,457,297 A | 10/1995 | Chen |
| 5,477,430 A | 12/1995 | LaRose et al. |
| 5,481,074 A | 1/1996 | English |
| 5,504,283 A | 4/1996 | Kako et al. |
| 5,512,719 A | 4/1996 | Okada et al. |
| 5,625,532 A | 4/1997 | Sellers |
| 5,804,780 A | 9/1998 | Bartha |
| 5,828,015 A | 10/1998 | Coulon |
| 5,847,337 A | 12/1998 | Chen |
| 5,874,700 A | 2/1999 | Hochgesang |
| 5,875,013 A | 2/1999 | Takahara |
| 5,876,106 A | 3/1999 | Kordecki et al. |
| 5,878,872 A | 3/1999 | Tsai |
| 5,881,866 A | 3/1999 | Miyajima et al. |
| 5,898,147 A | 4/1999 | Domzaiski et al. |
| 5,924,555 A | 7/1999 | Sadamori et al. |
| 5,935,691 A | 8/1999 | Tsai |
| 5,960,942 A | 10/1999 | Thornton |
| 5,986,227 A | 11/1999 | Hon |
| 6,020,565 A | 2/2000 | Pan |
| 6,068,416 A | 5/2000 | Kumamoto et al. |
| 6,215,420 B1 | 4/2001 | Harrison et al. |
| 6,257,782 B1 | 7/2001 | Maruyama et al. |
| 6,259,046 B1 | 7/2001 | Iwama et al. |
| 6,377,685 B1 | 4/2002 | Krishnan |
| 6,388,219 B2 | 5/2002 | Hsu et al. |
| 6,423,918 B1 | 7/2002 | King et al. |
| 6,482,032 B1 | 11/2002 | Szu et al. |
| 6,530,283 B2 | 3/2003 | Okada et al. |
| 6,538,801 B2 | 3/2003 | Jacobson et al. |
| 6,542,355 B1 | 4/2003 | Huang |
| 6,552,287 B2 | 4/2003 | Janniere |
| 6,556,112 B1 | 4/2003 | Van Zeeland et al. |
| 6,559,399 B2 | 5/2003 | Hsu et al. |
| 6,560,612 B1 | 5/2003 | Yamada et al. |
| 6,572,289 B2 | 6/2003 | Lo et al. |
| 6,573,463 B2 | 6/2003 | Ono |
| 6,585,435 B2 | 7/2003 | Fang |
| 6,624,369 B2 | 9/2003 | Ito et al. |
| 6,706,986 B2 | 3/2004 | Hsu |
| 6,738,050 B2 | 5/2004 | Comiskey |
| 6,750,414 B2 | 6/2004 | Sullivan |
| 6,759,614 B2 | 7/2004 | Yoneyama |
| 6,762,381 B2 | 7/2004 | Kunthady et al. |
| 6,765,503 B1 | 7/2004 | Chan et al. |
| 6,788,450 B2 | 9/2004 | Kawai et al. |
| 6,797,906 B2 | 9/2004 | Ohashi |
| 6,850,227 B2 | 2/2005 | Takahashi et al. |
| 6,860,660 B2 | 3/2005 | Hochgesang et al. |
| 6,911,608 B2 | 6/2005 | Levy |
| 6,926,418 B2 | 8/2005 | Ostergård et al. |
| 6,940,030 B2 | 9/2005 | Takeda et al. |
| 6,977,352 B2 | 12/2005 | Oosawa |
| 6,979,792 B1 | 12/2005 | Lai |
| 6,987,466 B1 | 1/2006 | Welch et al. |
| 6,987,503 B2 | 1/2006 | Inoue |
| 7,012,206 B2 | 3/2006 | Oikawa |
| 7,030,330 B2 | 4/2006 | Suda |
| 7,038,832 B2 | 5/2006 | Kanbe |
| 7,129,930 B1 | 10/2006 | Cathey et al. |
| 7,134,205 B2 | 11/2006 | Bruennel |
| 7,146,701 B2 | 12/2006 | Mahoney et al. |
| 7,151,236 B2 | 12/2006 | Ducruet et al. |
| 7,151,237 B2 | 12/2006 | Mahoney et al. |
| 7,154,059 B2 | 12/2006 | Chou |
| 7,166,813 B2 | 1/2007 | Soma |
| 7,172,303 B2 | 2/2007 | Shipman et al. |
| 7,189,932 B2 | 3/2007 | Kim |
| 7,256,766 B2 | 8/2007 | Albert et al. |
| 7,283,119 B2 | 10/2007 | Kishi |
| 7,301,113 B2 | 11/2007 | Nishimura et al. |
| 7,312,790 B2 | 12/2007 | Sato et al. |
| 7,385,806 B2 | 6/2008 | Liao |
| 7,391,555 B2 | 6/2008 | Albert et al. |

(56) References Cited

U.S. PATENT DOCUMENTS

| | | |
|---|---|---|
| 7,414,213 B2 | 8/2008 | Hwang |
| 7,429,707 B2 | 9/2008 | Yanai et al. |
| 7,432,460 B2 | 10/2008 | Clegg |
| 7,510,342 B2 | 3/2009 | Lane et al. |
| 7,531,764 B1 | 5/2009 | Lev et al. |
| 7,541,554 B2 | 6/2009 | Hou |
| 7,589,292 B2 | 9/2009 | Jung et al. |
| 7,639,187 B2 | 12/2009 | Caballero et al. |
| 7,639,571 B2 | 12/2009 | Ishii et al. |
| 7,651,231 B2 | 1/2010 | Chou et al. |
| 7,679,010 B2 | 3/2010 | Wingett |
| 7,724,415 B2 | 5/2010 | Yamaguchi |
| 7,781,690 B2 | 8/2010 | Ishii |
| 7,813,774 B2 | 10/2010 | Perez-Noguera |
| 7,842,895 B2 | 11/2010 | Lee |
| 7,847,204 B2 | 12/2010 | Tsai |
| 7,851,819 B2 | 12/2010 | Shi |
| 7,866,866 B2 | 1/2011 | Wahlstrom |
| 7,893,376 B2 | 2/2011 | Chen |
| 7,923,653 B2 | 4/2011 | Ohsumi |
| 7,947,915 B2 | 5/2011 | Lee et al. |
| 7,999,748 B2 | 8/2011 | Ligtenberg et al. |
| 8,063,325 B2 | 11/2011 | Sung et al. |
| 8,077,096 B2 | 12/2011 | Chiang et al. |
| 8,080,744 B2 | 12/2011 | Yeh et al. |
| 8,098,228 B2 | 1/2012 | Shimodaira et al. |
| 8,109,650 B2 | 2/2012 | Chang et al. |
| 8,119,945 B2 | 2/2012 | Lin |
| 8,124,903 B2 | 2/2012 | Tatehata et al. |
| 8,134,094 B2 | 3/2012 | Tsao et al. |
| 8,143,982 B1 | 3/2012 | Lauder et al. |
| 8,156,172 B2 | 4/2012 | Muehl et al. |
| 8,178,808 B2 | 5/2012 | Strittmatter et al. |
| 8,184,021 B2 | 5/2012 | Chou |
| 8,212,160 B2 | 7/2012 | Tsao |
| 8,212,162 B2 | 7/2012 | Zhou |
| 8,218,301 B2 | 7/2012 | Lee |
| 8,232,958 B2 | 7/2012 | Tolbert |
| 8,246,228 B2 | 8/2012 | Ko et al. |
| 8,253,048 B2 | 8/2012 | Ozias et al. |
| 8,253,052 B2 | 9/2012 | Chen |
| 8,263,887 B2 | 9/2012 | Chen et al. |
| 8,289,280 B2 | 10/2012 | Travis |
| 8,299,382 B2 | 10/2012 | Takemae et al. |
| 8,317,384 B2 | 11/2012 | Chung et al. |
| 8,319,298 B2 | 11/2012 | Hsu |
| 8,325,141 B2 | 12/2012 | Marsden |
| 8,330,725 B2 | 12/2012 | Mahowald et al. |
| 8,354,629 B2 | 1/2013 | Lin |
| 8,378,857 B2 | 2/2013 | Pance |
| 8,383,972 B2 | 2/2013 | Liu |
| 8,384,566 B2 | 2/2013 | Bocirnea |
| 8,404,990 B2 | 3/2013 | Lutgring et al. |
| 8,451,146 B2 | 3/2013 | Mahowald et al. |
| 8,431,849 B2 | 4/2013 | Chen |
| 8,436,265 B2 | 5/2013 | Koike et al. |
| 8,462,514 B2 | 6/2013 | Myers et al. |
| 8,500,348 B2 | 8/2013 | Dumont et al. |
| 8,502,094 B2 | 8/2013 | Chen |
| 8,542,194 B2 | 9/2013 | Akens et al. |
| 8,548,528 B2 | 10/2013 | Kim et al. |
| 8,564,544 B2 | 10/2013 | Jobs et al. |
| 8,569,639 B2 | 10/2013 | Strittmatter |
| 8,575,632 B2 | 11/2013 | Kuramoto et al. |
| 8,581,127 B2 | 11/2013 | Jhuang et al. |
| 8,592,699 B2 | 11/2013 | Kessler et al. |
| 8,592,702 B2 | 11/2013 | Tsai |
| 8,592,703 B2 | 11/2013 | Johnson et al. |
| 8,604,370 B2 | 12/2013 | Chao |
| 8,629,362 B1 | 1/2014 | Knighton et al. |
| 8,642,904 B2 | 2/2014 | Chiba et al. |
| 8,651,720 B2 | 2/2014 | Sherman et al. |
| 8,659,882 B2 | 2/2014 | Liang et al. |
| 8,731,618 B2 | 5/2014 | Jarvis et al. |
| 8,748,767 B2 | 6/2014 | Ozias et al. |
| 8,759,705 B2 | 6/2014 | Funakoshi et al. |
| 8,760,405 B2 | 6/2014 | Nam |
| 8,786,548 B2 | 7/2014 | Oh et al. |
| 8,791,378 B2 | 7/2014 | Lan |
| 8,835,784 B2 | 9/2014 | Hirota |
| 8,847,090 B2 | 9/2014 | Ozaki |
| 8,847,711 B2 | 9/2014 | Yang et al. |
| 8,853,580 B2 | 10/2014 | Chen |
| 8,854,312 B2 | 10/2014 | Meierling |
| 8,870,477 B2 | 10/2014 | Merminod et al. |
| 8,884,174 B2 | 11/2014 | Chou et al. |
| 8,921,473 B1 | 12/2014 | Hyman |
| 8,922,476 B2 | 12/2014 | Stewart et al. |
| 8,943,427 B2 | 1/2015 | Heo et al. |
| 8,976,117 B2 | 3/2015 | Krahenbuhl et al. |
| 8,994,641 B2 | 3/2015 | Stewart et al. |
| 9,007,297 B2 | 4/2015 | Stewart et al. |
| 9,012,795 B2 | 4/2015 | Niu et al. |
| 9,029,723 B2 | 5/2015 | Pegg |
| 9,063,627 B2 | 6/2015 | Yairi et al. |
| 9,064,642 B2 | 6/2015 | Welch et al. |
| 9,086,733 B2 | 7/2015 | Pance |
| 9,087,663 B2 | 7/2015 | Los |
| 9,093,229 B2 | 7/2015 | Leong et al. |
| 9,213,416 B2 | 12/2015 | Chen |
| 9,223,352 B2 | 12/2015 | Smith et al. |
| 9,234,486 B2 | 1/2016 | Das et al. |
| 9,235,236 B2 | 1/2016 | Nam |
| 9,274,654 B2 | 3/2016 | Slobodin et al. |
| 9,275,810 B2 | 3/2016 | Pance et al. |
| 9,300,033 B2 | 3/2016 | Han et al. |
| 9,305,496 B2 | 4/2016 | Kimura |
| 9,443,672 B2 | 9/2016 | Martisauskas |
| 9,448,628 B2 | 9/2016 | Tan et al. |
| 9,471,185 B2 | 10/2016 | Guard |
| 9,477,382 B2 | 10/2016 | Hicks et al. |
| 9,612,674 B2 | 4/2017 | Degner et al. |
| 9,734,965 B2 | 8/2017 | Martinez et al. |
| 9,793,066 B1 | 10/2017 | Brock et al. |
| 2002/0079211 A1 | 6/2002 | Katayama et al. |
| 2002/0093436 A1 | 7/2002 | Lien |
| 2002/0113770 A1 | 8/2002 | Jacobson et al. |
| 2002/0149835 A1 | 10/2002 | Kanbe |
| 2003/0169232 A1 | 9/2003 | Ito |
| 2004/0004559 A1 | 1/2004 | Rast |
| 2004/0225965 A1 | 11/2004 | Garside et al. |
| 2004/0257247 A1 | 12/2004 | Lin et al. |
| 2005/0035950 A1 | 2/2005 | Daniels |
| 2005/0253801 A1 | 11/2005 | Kobayashi |
| 2006/0011458 A1 | 1/2006 | Purcocks |
| 2006/0020469 A1 | 1/2006 | Rast |
| 2006/0120790 A1 | 6/2006 | Chang |
| 2006/0181511 A1 | 8/2006 | Woolley |
| 2006/0243987 A1 | 11/2006 | Lai |
| 2007/0084710 A1* | 4/2007 | Koyano ............... H01H 9/52 |
| | | 200/341 |
| 2007/0200823 A1 | 8/2007 | Bytheway et al. |
| 2007/0285393 A1 | 12/2007 | Ishakov |
| 2008/0131184 A1 | 6/2008 | Brown et al. |
| 2008/0136782 A1 | 6/2008 | Mundt et al. |
| 2009/0046053 A1 | 2/2009 | Shigehiro et al. |
| 2009/0103964 A1 | 4/2009 | Takagi et al. |
| 2009/0128496 A1 | 5/2009 | Huang |
| 2009/0262085 A1 | 10/2009 | Wassingbo et al. |
| 2009/0267892 A1 | 10/2009 | Faubert |
| 2010/0045705 A1 | 2/2010 | Vertegaal et al. |
| 2010/0066568 A1 | 3/2010 | Lee |
| 2010/0109921 A1 | 5/2010 | Annerfors |
| 2010/0156796 A1 | 6/2010 | Kim et al. |
| 2010/0253630 A1 | 10/2010 | Homma et al. |
| 2011/0032127 A1 | 2/2011 | Roush |
| 2011/0056817 A1 | 3/2011 | Wu |
| 2011/0056836 A1 | 3/2011 | Tatebe et al. |
| 2011/0205179 A1 | 8/2011 | Braun |
| 2011/0261031 A1 | 10/2011 | Muto |
| 2011/0267272 A1* | 11/2011 | Meyer ................ G06F 1/182 |
| | | 345/168 |
| 2011/0284355 A1 | 11/2011 | Yang |
| 2011/0303521 A1 | 12/2011 | Niu et al. |

(56) References Cited

U.S. PATENT DOCUMENTS

| | | |
|---|---|---|
| 2012/0012446 A1 | 1/2012 | Hwa |
| 2012/0032972 A1 | 2/2012 | Hwang |
| 2012/0090973 A1 | 4/2012 | Liu |
| 2012/0098751 A1 | 4/2012 | Liu |
| 2012/0286701 A1 | 11/2012 | Yang et al. |
| 2012/0298496 A1 | 11/2012 | Zhang |
| 2012/0313856 A1 | 12/2012 | Hsieh |
| 2013/0043115 A1 | 2/2013 | Yang et al. |
| 2013/0093500 A1 | 4/2013 | Bruwer |
| 2013/0093733 A1 | 4/2013 | Yoshida |
| 2013/0100030 A1 | 4/2013 | Los et al. |
| 2013/0120265 A1 | 5/2013 | Horii et al. |
| 2013/0161170 A1 | 6/2013 | Fan et al. |
| 2013/0215079 A1 | 8/2013 | Johnson et al. |
| 2013/0242601 A1 | 9/2013 | Kloeppel et al. |
| 2013/0270090 A1 | 10/2013 | Lee |
| 2014/0015777 A1 | 1/2014 | Park et al. |
| 2014/0027259 A1 | 1/2014 | Kawana et al. |
| 2014/0071654 A1 | 3/2014 | Chien |
| 2014/0082490 A1 | 3/2014 | Jung et al. |
| 2014/0090967 A1 | 4/2014 | Inagaki |
| 2014/0098042 A1 | 4/2014 | Kuo et al. |
| 2014/0116865 A1 | 5/2014 | Leong et al. |
| 2014/0118264 A1 | 5/2014 | Leong et al. |
| 2014/0151211 A1 | 6/2014 | Zhang |
| 2014/0184496 A1 | 7/2014 | Gribetz et al. |
| 2014/0191973 A1 | 7/2014 | Zellers et al. |
| 2014/0218851 A1* | 8/2014 | Klein ............... H05K 3/20 361/679.02 |
| 2014/0252881 A1 | 9/2014 | Dinh et al. |
| 2014/0291133 A1 | 10/2014 | Fu et al. |
| 2014/0320436 A1 | 10/2014 | Modarres et al. |
| 2014/0346025 A1 | 11/2014 | Hendren et al. |
| 2014/0375141 A1 | 12/2014 | Nakajima |
| 2015/0016038 A1 | 1/2015 | Niu et al. |
| 2015/0083561 A1 | 3/2015 | Han et al. |
| 2015/0090570 A1 | 4/2015 | Kwan et al. |
| 2015/0090571 A1 | 4/2015 | Leong et al. |
| 2015/0227207 A1 | 8/2015 | Winter et al. |
| 2015/0243457 A1 | 8/2015 | Niu et al. |
| 2015/0270073 A1 | 9/2015 | Yarak, III et al. |
| 2015/0277559 A1 | 10/2015 | Vescovi et al. |
| 2015/0287553 A1 | 10/2015 | Welch et al. |
| 2015/0309538 A1 | 10/2015 | Zhang |
| 2015/0332874 A1 | 11/2015 | Brock et al. |
| 2015/0348726 A1 | 12/2015 | Hendren |
| 2015/0378391 A1 | 12/2015 | Huitema et al. |
| 2016/0049266 A1 | 2/2016 | Stringer et al. |
| 2016/0093452 A1 | 3/2016 | Zercoe et al. |
| 2016/0172129 A1 | 6/2016 | Zercoe et al. |
| 2016/0189890 A1 | 6/2016 | Leong et al. |
| 2016/0189891 A1 | 6/2016 | Zercoe et al. |
| 2016/0259375 A1 | 9/2016 | Andre et al. |
| 2016/0329166 A1 | 11/2016 | Hou et al. |
| 2016/0336124 A1 | 11/2016 | Leong et al. |
| 2016/0336127 A1 | 11/2016 | Leong et al. |
| 2016/0336128 A1 | 11/2016 | Leong et al. |
| 2016/0343523 A1 | 11/2016 | Hendren et al. |
| 2016/0351360 A1 | 12/2016 | Knopf et al. |
| 2016/0365204 A1 | 12/2016 | Cao et al. |
| 2016/0378234 A1 | 12/2016 | Ligtenberg et al. |
| 2016/0379775 A1 | 12/2016 | Leong et al. |
| 2017/0004937 A1 | 1/2017 | Leong et al. |
| 2017/0004939 A1 | 1/2017 | Kwan et al. |
| 2017/0011869 A1 | 1/2017 | Knopf et al. |
| 2017/0090106 A1 | 3/2017 | Cao et al. |
| 2017/0301487 A1 | 10/2017 | Leong et al. |
| 2017/0315624 A1 | 11/2017 | Leong et al. |
| 2018/0029339 A1 | 2/2018 | Liu et al. |
| 2018/0040441 A1 | 2/2018 | Wu et al. |
| 2018/0074694 A1 | 3/2018 | Lehmann et al. |

FOREIGN PATENT DOCUMENTS

| | | |
|---|---|---|
| CN | 1533128 | 9/2004 |
| CN | 1542497 | 11/2004 |
| CN | 2672832 | 1/2005 |
| CN | 1624842 | 6/2005 |
| CN | 1812030 | 8/2006 |
| CN | 1838036 | 9/2006 |
| CN | 1855332 | 11/2006 |
| CN | 101051569 | 10/2007 |
| CN | 200961844 | 10/2007 |
| CN | 200986871 | 12/2007 |
| CN | 101146137 | 3/2008 |
| CN | 201054315 | 4/2008 |
| CN | 201084602 | 7/2008 |
| CN | 201123174 | 9/2008 |
| CN | 201149829 | 11/2008 |
| CN | 101315841 | 12/2008 |
| CN | 201210457 | 3/2009 |
| CN | 101438228 | 5/2009 |
| CN | 101465226 | 6/2009 |
| CN | 101494130 | 7/2009 |
| CN | 101502082 | 8/2009 |
| CN | 201298481 | 8/2009 |
| CN | 101546667 | 9/2009 |
| CN | 101572195 | 11/2009 |
| CN | 101800281 | 8/2010 |
| CN | 101807482 | 8/2010 |
| CN | 101868773 | 10/2010 |
| CN | 201655616 | 11/2010 |
| CN | 102110542 | 6/2011 |
| CN | 102119430 | 7/2011 |
| CN | 201904256 | 7/2011 |
| CN | 102163084 | 8/2011 |
| CN | 201927524 | 8/2011 |
| CN | 201945951 | 8/2011 |
| CN | 201945952 | 8/2011 |
| CN | 201956238 | 8/2011 |
| CN | 102197452 | 9/2011 |
| CN | 202008941 | 10/2011 |
| CN | 202040690 | 11/2011 |
| CN | 102280292 | 12/2011 |
| CN | 102338348 | 2/2012 |
| CN | 102375550 | 3/2012 |
| CN | 202205161 | 4/2012 |
| CN | 102496509 | 6/2012 |
| CN | 10269527 | 8/2012 |
| CN | 102622089 | 8/2012 |
| CN | 102629526 | 8/2012 |
| CN | 202372927 | 8/2012 |
| CN | 102679239 | 9/2012 |
| CN | 102683072 | 9/2012 |
| CN | 202434387 | 9/2012 |
| CN | 202523007 | 11/2012 |
| CN | 102832068 | 12/2012 |
| CN | 102955573 | 3/2013 |
| CN | 102956386 | 3/2013 |
| CN | 102969183 | 3/2013 |
| CN | 103000417 | 3/2013 |
| CN | 103165327 | 6/2013 |
| CN | 103180979 | 6/2013 |
| CN | 203012648 | 6/2013 |
| CN | 203135988 | 8/2013 |
| CN | 103377841 | 10/2013 |
| CN | 103489986 | 1/2014 |
| CN | 203414880 | 1/2014 |
| CN | 103681056 | 3/2014 |
| CN | 103699181 | 4/2014 |
| CN | 203520312 | 4/2014 |
| CN | 203588895 | 5/2014 |
| CN | 103839715 | 6/2014 |
| CN | 103839720 | 6/2014 |
| CN | 103839722 | 6/2014 |
| CN | 103903891 | 7/2014 |
| CN | 103956290 | 7/2014 |
| CN | 203733685 | 7/2014 |
| CN | 104021968 | 9/2014 |
| CN | 204102769 | 1/2015 |
| CN | 204117915 | 1/2015 |

(56) References Cited

FOREIGN PATENT DOCUMENTS

| | | |
|---|---|---|
| CN | 104517769 | 4/2015 |
| CN | 204632641 | 9/2015 |
| CN | 105097341 | 11/2015 |
| DE | 2530176 | 1/1977 |
| DE | 3002772 | 7/1981 |
| DE | 29704100 | 4/1997 |
| DE | 202008001970 | 8/2008 |
| EP | 0441993 | 8/1991 |
| EP | 1835272 | 9/2007 |
| EP | 1928008 | 6/2008 |
| EP | 2022606 | 6/2010 |
| EP | 2426688 | 3/2012 |
| EP | 2439760 | 4/2012 |
| EP | 2463798 | 6/2012 |
| EP | 2664979 | 11/2013 |
| FR | 2147420 | 3/1973 |
| FR | 2911000 | 7/2008 |
| FR | 2950193 | 3/2011 |
| GB | 1361459 | 7/1974 |
| JP | S50115562 | 9/1975 |
| JP | S60055477 | 3/1985 |
| JP | S61172422 | 10/1986 |
| JP | S62072429 | 4/1987 |
| JP | S63182024 | 11/1988 |
| JP | H0422024 | 4/1992 |
| JP | H0520963 | 1/1993 |
| JP | H0524512 | 8/1993 |
| JP | H05342944 | 12/1993 |
| JP | H09204148 | 8/1997 |
| JP | H10312726 | 11/1998 |
| JP | H11194882 | 7/1999 |
| JP | 2000010709 | 1/2000 |
| JP | 2000057871 | 2/2000 |
| JP | 2000339097 | 12/2000 |
| JP | 2001100889 | 4/2001 |
| JP | 2003114751 | 9/2001 |
| JP | 2002260478 | 9/2002 |
| JP | 2002298689 | 10/2002 |
| JP | 2003522998 | 7/2003 |
| JP | 2005108041 | 4/2005 |
| JP | 2006164929 | 6/2006 |
| JP | 2006185906 | 7/2006 |
| JP | 2006521664 | 9/2006 |
| JP | 2006269439 | 10/2006 |
| JP | 2006277013 | 10/2006 |
| JP | 2006344609 | 12/2006 |
| JP | 2007115633 | 5/2007 |
| JP | 2007514247 | 5/2007 |
| JP | 2007156983 | 6/2007 |
| JP | 2008021428 | 1/2008 |
| JP | 2008041431 | 2/2008 |
| JP | 2008100129 | 5/2008 |
| JP | 2008191850 | 8/2008 |
| JP | 2008533559 | 8/2008 |
| JP | 2008293922 | 12/2008 |
| JP | 2009099503 | 5/2009 |
| JP | 2009181894 | 8/2009 |
| JP | 2010061956 | 3/2010 |
| JP | 2010244088 | 10/2010 |
| JP | 2010244302 | 10/2010 |
| JP | 2011018484 | 1/2011 |
| JP | 2011065126 | 3/2011 |
| JP | 2011150804 | 8/2011 |
| JP | 2011165630 | 8/2011 |
| JP | 2011524066 | 8/2011 |
| JP | 2011187297 | 9/2011 |
| JP | 2012022473 | 2/2012 |
| JP | 2012043705 | 3/2012 |
| JP | 2012063630 | 3/2012 |
| JP | 2012098873 | 5/2012 |
| JP | 2012134064 | 7/2012 |
| JP | 2012186067 | 9/2012 |
| JP | 2012230256 | 11/2012 |
| JP | 2014017179 | 1/2014 |
| JP | 2014026807 | 2/2014 |
| JP | 2014216190 | 11/2014 |
| JP | 2014220039 | 11/2014 |
| JP | 2016053778 | 4/2016 |
| KR | 1019990007394 | 1/1999 |
| KR | 1020020001668 | 1/2002 |
| KR | 100454203 | 10/2004 |
| KR | 1020060083032 | 7/2006 |
| KR | 1020080064116 | 7/2008 |
| KR | 1020080066164 | 7/2008 |
| KR | 2020110006385 | 6/2011 |
| KR | 1020120062797 | 6/2012 |
| KR | 1020130040131 | 4/2013 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| TW | 201246251 | 11/2012 |
| TW | 201403646 | 1/2014 |
| WO | WO9744946 | 11/1997 |
| WO | WO2005/057320 | 6/2005 |
| WO | WO2006/022313 | 3/2006 |
| WO | WO2007/049253 | 5/2007 |
| WO | WO2008/045833 | 4/2008 |
| WO | WO2009/005026 | 1/2009 |
| WO | WO2012/011282 | 1/2012 |
| WO | WO2012/027978 | 3/2012 |
| WO | WO2013/096478 | 6/2013 |
| WO | WO2014175446 | 10/2014 |

OTHER PUBLICATIONS

U.S. Appl. No. 14/501,680, filed Sep. 30, 2014, pending.
U.S. Appl. No. 14/736,151, filed Jun. 10, 2015, pending.
U.S. Appl. No. 14/765,145, filed Jul. 31, 2015, pending.
U.S. Appl. No. 14/826,590, filed Aug. 14, 2015, pending.
U.S. Appl. No. 14/867,598, filed Sep. 28, 2015, pending.
U.S. Appl. No. 14/867,672, filed Sep. 28, 2015, pending.
U.S. Appl. No. 14/867,746, filed Sep. 28, 2015, pending.
U.S. Appl. No. 15/615,806, filed Jun. 6, 2017, pending.
U.S. Appl. No. 15/687,297, filed Aug. 25, 2017, pending.
U.S. Appl. No. 15/940,909, filed Mar. 29, 2018, pending.
Elekson, "Reliable and Tested Wearable Electronics Embedment Solutions," http://www.wearable.technology/our-technologies, 3 pages, at least as early as Jan. 6, 2016.
U.S. Appl. No. 15/014,596, filed Feb. 3, 2016, pending.
U.S. Appl. No. 15/154,682, filed May 13, 2016, pending.
U.S. Appl. No. 15/154,706, filed May 13, 2016, pending.
U.S. Appl. No. 15/154,723, filed May 13, 2016, pending.
U.S. Appl. No. 15/154,768, filed May 13, 2016, pending.
U.S. Appl. No. 15/230,740, filed Aug. 8, 2016, pending.
U.S. Appl. No. 15/230,724, filed Aug. 8, 2016, pending.
U.S. Appl. No. 15/261,954, filed Sep. 11, 2016, pending.
U.S. Appl. No. 15/261,972, filed Sep. 11, 2016, pending.
U.S. Appl. No. 15/262,249, filed Sep. 12, 2016, pending.
U.S. Appl. No. 15/264,827, filed Sep. 14, 2016, pending.
U.S. Appl. No. 15/268,518, filed Sep. 16, 2016, pending.
U.S. Appl. No. 15/269,790, filed Sep. 19, 2016, pending.

\* cited by examiner

VENTING SYSTEM AND SHIELD FOR KEYBOARD

CROSS-REFERENCE TO RELATED APPLICATIONS

This application is a non-provisional patent application of and claims the benefit to U.S. Provisional Patent Application No. 62/058,087, filed Sep. 30, 2014, and titled "Keyboard Assembly," U.S. Provisional Patent Application No. 62/129,842, filed Mar. 7, 2015, and titled "Venting System for Keyboard Assembly," U.S. Provisional Patent Application No. 62/058,081, filed Sep. 30, 2014, and titled "Keyboard Assembly," U.S. Provisional Patent Application No. 62/129,843, filed Mar. 7, 2015, and titled "Light Assembly for Keyboard Assembly," U.S. Provisional Patent Application No. 62/058,074, filed Sep. 30, 2014, and titled "Keyboard Assembly," U.S. Provisional Patent Application No. 62/129,841, filed Mar. 7, 2015, and titled "Key for Keyboard Assembly," U.S. Provisional Patent Application No. 62/058,067, filed Sep. 30, 2014 and titled "Keyboard Assembly," and U.S. Provisional Patent Application No. 62/129,840, filed Mar. 7, 2015, and titled "Dome Switch for Keyboard Assembly," the disclosures of which are hereby incorporated herein by reference in their entirety.

FIELD

The disclosure relates generally to a keyboard assembly and, more particularly, to a venting system for a keyboard assembly.

BACKGROUND

Electronic devices typically include one or more input devices such as keyboards, touchpads, mice, or touchscreens to enable a user to interact with the device. These devices can be integrated into an electronic device or can stand alone as discrete devices that can transmit signals to another device via wired or wireless connection. For example, a keyboard can be integrated into the casing of a laptop computer. When integrated within the casing of the laptop computer, all of the components of the keyboard must be included within the casing of the laptop computer.

Conventional keyboards can provide inputs to electronic devices using a variety of input interfaces including one or more switches, buttons, actuators, or sensors (e.g., touch sensors), the actuation of which can be detect by the electronic device. In an example, the keyboard of the electronic device can include a button having a dome switch, which can be depressed to provide a detectable input. The dome switch is typically constructed by placing a conductive dome over a contact pad on a circuit board. When the dome is pressed, it may collapse such that an inner surface of the dome contacts the contact pad to form an electrical signal or input to the electronic device.

A dome switch can enclose a volume of air between the inner surface of the dome and the circuit board to which the dome is mounted. When the dome is depressed, the air within the enclosed volume needs to be displaced so that the center of the dome can contact the circuit board contact pad. Conventional key assemblies include an outer layer or membrane covering the dome switch that may allow the air to move through openings formed in the dome switch and subsequently permeate through the outer layer.

However, these openings in the dome switch and the permeable properties of the outer layer may leave the dome switch, the circuit board under the dome switch and/or the keyboard assembly vulnerable to damage. For example, water may pass through the outer layer and/or the openings formed in the dome switch and may damage the circuit board. As a result, the circuit board may be damaged or inoperable, rendering the keyboard of the electronic device partially or completely inoperable.

SUMMARY

A keyboard assembly is disclosed. The keyboard assembly comprises a printed circuit board defining a set of apertures; a group of switch housings coupled to the printed circuit board, each switch housing of the group of switch housings defining a switch opening positioned above one of the set of apertures of the printed circuit board; and a shield defining at least one channel formed below the printed circuit board, the at least one channel in fluid communication with at least one aperture, and at least one of the switch openings above the at least one aperture.

A keyboard assembly is disclosed. The keyboard assembly comprises: a substrate comprising a surface defining recesses; an array of key assemblies, each of the array of key assemblies positioned at least partially within a unique one of the recesses; and a shield beneath the printed circuit board and defining a venting system in fluid communication with each of the array of key assemblies; wherein the array of key assemblies is affixed to the substrate.

A shield for an input device is disclosed. The shield comprises a base layer, an aluminum layer positioned over the base layer, a graphite layer positioned over the aluminum layer, and an intermediate layer positioned over the graphite layer. The shield also comprises an adhesive sheet comprising a venting system positioned over the intermediate layer and a conductive ring substantially surrounding the adhesive layer.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to a keyboard assembly and, more particularly, to a venting system for a keyboard assembly. The venting system may provide an exit path for air beneath a switch, such as a dome switch, of a key. When the key is pressed, the dome switch at least partially collapses. If the air beneath the dome switch and/or within the switch housing cannot escape, then the force required to collapse the dome may be greater than desired. Further, the dome switch may rupture rather than collapse.

In a particular embodiment, a venting system may be formed within a shield below a substrate, such as a printed circuit board, on which a switch housing is affixed. The switch housing may house a dome switch. The substrate may define a set of apertures positioned below the dome switch and is in fluid communication with a channel formed in a portion of a shield for the keyboard. The shield may be configured as a planar element having multiple layers, in some embodiments.

When the dome switch collapses, air below the dome switch may flow through an aperture and into the channel formed in the shield. This may provide an exit path for air below the dome switch (and/or within the dome switch housing) so the dome switch can collapse to close an electrical circuit and generate an input signal.

In another particular embodiment, a shield is formed from multiple components and/or sub-layers to improve functionality and reduce the thickness of the keyboard assembly. For example, the shield includes various conductive components that facilitate or improve electrical connection within the various portions of the electronic device. The shield and/or its various components may electromagnetically shield circuit boards and other noise-sensitive parts of an input device.

Additionally, the shield can include an adhesive sheet, and channels can be at least partly formed in the adhesive sheet to form a venting system, as discussed herein. Further, the configuration and/or position of each component and/or sub-layer within the shield reduces the size of the shield, which in turn, reduces the required space for the shield within the keyboard assembly and/or the electronic device.

These and other embodiments are discussed below with reference to FIGS. 1-14. However, those skilled in the art will readily appreciate that the detailed description given herein with respect to these Figures is for explanatory purposes only and should not be construed as limiting.

Figure 1:
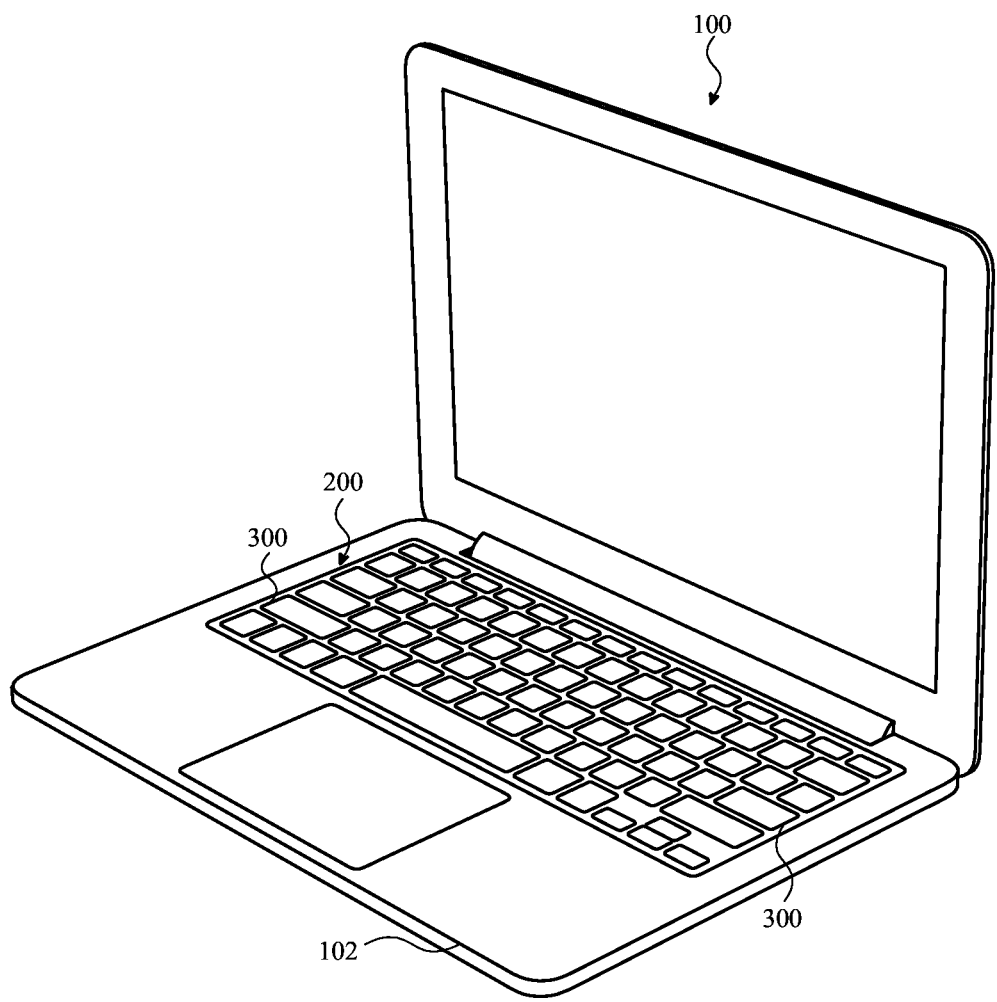
FIG. 1 shows an electronic device including a low-travel keyboard assembly, according to embodiments.

FIG. 1 shows an electronic device 100, including a low-travel keyboard assembly 200 that may incorporate a venting system, as described in more detail below with respect to FIGS. 2-14. In a non-limiting example, as shown in FIG. 1, electronic device 100 may be a laptop computer. However, it is understood that electronic device 100 may be configured as any suitable electronic device that may utilize low-travel keyboard assembly 200. Other embodiments can implement electronic device 100 differently, such as, for example, a desktop computer, a tablet computing device, a smartphone, a gaming device, a display, a digital music player, a wearable computing device or display, a health monitoring device, and so on.

Electronic device 100 may include a top case 102. Top case 102 may take the form of an exterior, protective casing (e.g., housing) or shell for electronic device 100 and the various internal components (for example, low-travel keyboard assembly 200) of electronic device 100. Top case 102 may be formed as a single, integral component or may have a group of distinct components that may be configured to be coupled to one another, as discussed herein. Additionally, top case 102 may be formed from any suitable material that provides a protective casing or shell for electronic device 100 and the various components included in electronic device 100. In non-limiting examples, top case 102 may be made from metal, a ceramic, a rigid plastic or another polymer, a fiber-matrix composite, and so on.

Low-travel keyboard assembly 200 may be included within electronic device 100 to allow a user to interact with electronic device 100. As shown in FIG. 1, low-travel keyboard assembly 200 is positioned within and/or may be received by top case 102 of electronic device 100. Low-travel keyboard assembly 200 may include a set of keycaps 300 positioned within and partially protruding through and/or surrounded by top case 102 of electronic device 100. As discussed herein, keycaps 300 are depressed and displaced to interact with and/or collapse a dome switch of low-travel keyboard assembly 200, which in turn forms an electrical signal or input to electronic device 100.

As discussed herein, low-travel keyboard assembly 200 can include a venting system that provides an exit path for air beneath a dome switch of keyboard assembly 200 when a keycap 300 is depressed. That is, the venting system may provide a flow path for air displaced when a key is pressed and an associated dome switch collapses. The venting system can be formed in a shield positioned below a substrate, such as a printed circuit board (PCB). A switch housing may surround a dome switch and be affixed or otherwise connected to the printed circuit board. The PCB includes an aperture positioned below the dome switch in fluid communication with a channel of the venting system formed in a portion of the shield. When the dome switch collapses, air below the dome switch flows through the aperture formed within the PCB and into the channel formed in the shield. Evacuation of the air may reduce the force necessary to collapse the dome switch and/or prevent the dome switch from rupturing.

As the dome switch partially or fully collapses, it may generate an electrical signal for electronic device 100. By encasing the dome switch within a dome switch housing, the dome switch and corresponding electrical connectors or contacts of the PCB are sealed and protected from damage or debris. Additionally, by forming the venting system below the dome switch and/or PCB, the dome switch remains sealed and/or protected from contaminants, while also providing an exit path for air beneath a collapsing dome switch. This ensures contact between the dome switch and the PCB to form an electrical signal in electronic device 100 including low-travel keyboard assembly 200.

Additionally, and as discussed herein, the air expelled from the switch housing of the low-travel keyboard assembly 200 may be expelled from various positions or portions of electronic device 100. Specifically, the air expelled from the switch housing can flow through the channels of the venting system and can be expelled into the atmosphere through openings formed in top case 102 provide a gaseous exit path within keyboard assembly 200. Additionally, in another non-limiting example, the switch housing can include a passageway formed through a side wall, such that the air under the dome switch can be expelled through the passageway formed through the switch housing when keycap 300 and/or the dome switch translate (e.g., move, collapse, and the like). In one embodiment, the air may be expelled through the passageway and into the atmosphere by flowing around keycap 300 and out through an opening formed in top case 102 of electronic device 100. In other embodiments, the air may be expelled through a dedicated exit that is not associated with any keycap. In still other embodiments, one or more reservoirs may be connected to the passageway(s), such that air may flow into the reservoir when the key is depressed and from the reservoir when the key is released. In such embodiments, the passageway or channel may not atmospherically vent at all. In still other embodiments, some combination of the foregoing may be used.

In the non-limiting example shown in FIG. 1, where electronic device 100 is a laptop computer, low-travel keyboard assembly 200 may be positioned within and/or may be received by electronic device 100. In an additional embodiment, low-travel keyboard assembly 200 may be a distinct, standalone component and may be in wired or wireless electrical communication with electronic device 100. Low-travel keyboard assembly 200 may be configured to allow a user to interact with electronic device 100.

Figure 2:
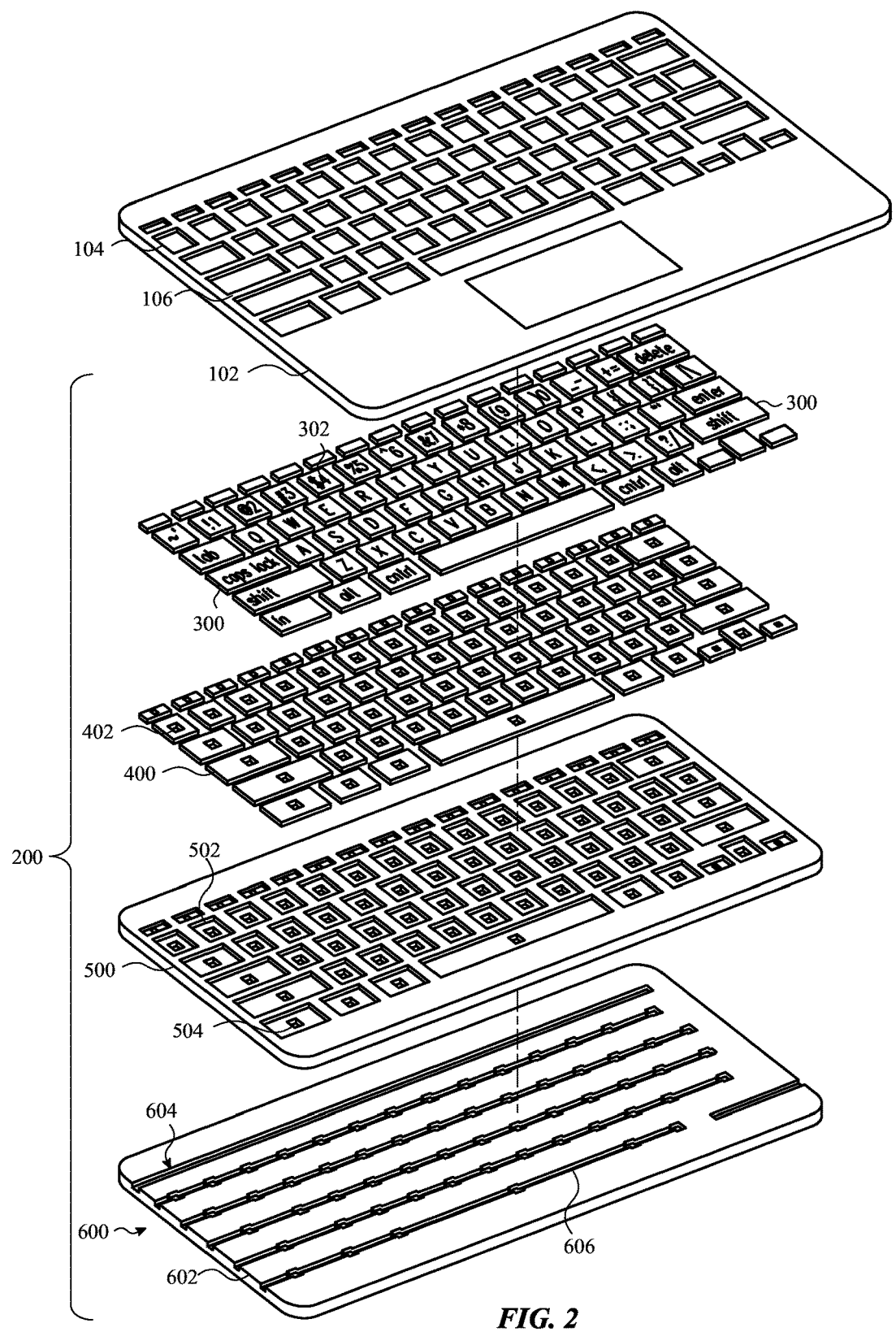
FIG. 2 shows an exploded view of a low-travel keyboard assembly for the electronic device of FIG. 1, according to embodiments.
Figure 3:
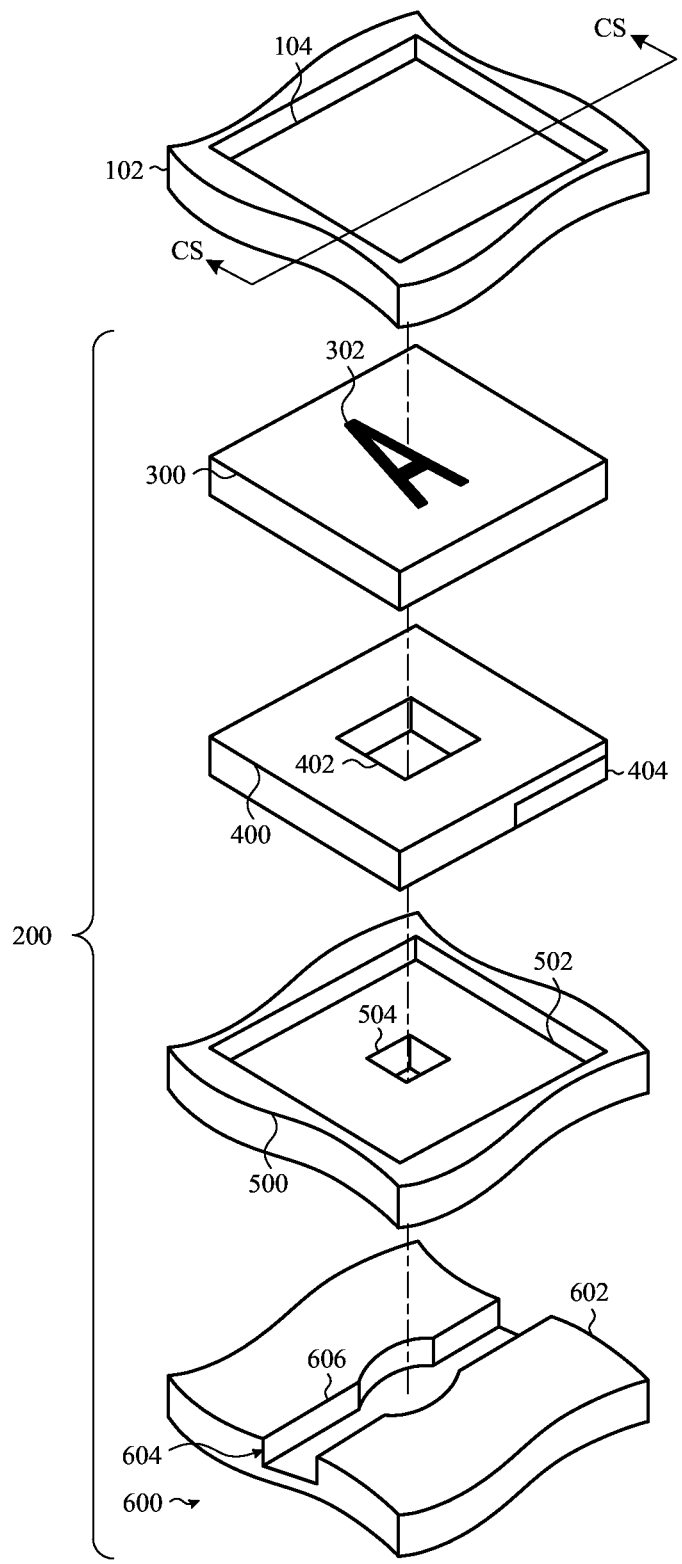
FIG. 3 shows an exploded view of a single key assembly and related support structures of the low-travel keyboard assembly of FIG. 2, according to embodiments.

FIG. 2 shows an exploded view of electronic device 100 of FIG. 1, according to an embodiment. Specifically, FIG. 2 shows an exploded view of top case 102 of electronic device 100, and low-travel keyboard assembly 200. Additionally, FIG. 3 shows a detailed exploded view of a portion of top case 102 of electronic device 100 and a single key assembly of low-travel keyboard assembly 200. It is understood that similarly named components or similarly numbered components may function in a substantially similar fashion, may include similar materials and/or may include similar interactions with other components. Redundant explanation of these components has been omitted for clarity.

As shown in FIGS. 2 and 3, top case 102 of electronic device 100 (see, FIG. 1) may include one or more keyholes 104 formed there through. Top case 102 may also include skeletal ribs 106 configured to be positioned between the keycaps 300, and may substantially surround and/or may be positioned within the space between the keycaps 300 of low-travel keyboard assembly 200.

Low-travel keyboard assembly 200 may be formed from a number of layers or components positioned adjacent to and/or coupled to one another. The components positioned in layers may be positioned adjacent to and/or coupled to one another and may be sandwiched between top case 102 and a bottom case (not shown) of electronic device 100.

The keycaps 300 of low-travel keyboard assembly 200 may be positioned within, and extend through and/or partially above keyholes 104 of top case 102. Each of the keycaps 300 may include a glyph 302 positioned on a top or exposed surface of the keycap 300. Each glyph 302 of keycap 300 may be substantially transparent to allow a light to be emitted through and/or illuminate keycap 300. In the non-limiting example shown in FIGS. 2 and 3, keycap 300 may be substantially opaque, except for glyph 302, such that glyph 302, and the perimeter of keycap 300, may be substantially illuminated by light emitted within low-travel keyboard assembly.

Switch housings 400 of low-travel keyboard assembly 200 may be positioned below corresponding keycaps 300 and may be configured to interact with keycaps 300. Each switch housing 400 of low-travel keyboard assembly 200 may include a dome switch opening 402 formed completely through switch housing 400, and a light emitting diode (LED) recess 404 (see, FIG. 3) formed within each switch housing 400. As discussed herein, dome switch opening 402 may receive and/or house a dome switch for low-travel keyboard assembly 200 which forms an electrical signal to interact with electronic device 100 (see, FIG. 1). LED recess 404 formed in switch housing 400 may receive an LED assembly 800 (see, FIG. 4), which may emit light through switch housing 400 for illuminating keycap 300 of low-travel keyboard assembly 200.

Low-travel keyboard assembly 200 may also include a printed circuit board (PCB) 500 positioned below the group of switch housings 400. As shown in FIGS. 2 and 3, PCB 500 may include a number of recesses 502 formed within PCB 500, and a set of apertures 504 formed completely through PCB 500 in recess 502. Each recess 502 of PCB 500 may receive a corresponding switch housing 400 of low-travel keyboard assembly 200. Additionally as shown in FIGS. 2 and 3, aperture 504 of PCB 500 may be substantially aligned with dome switch opening 402 of switch housing 400 of low-travel keyboard assembly 200. As discussed herein in detail, the apertures 504 of PCB 500 may be utilized to vent air and/or relieve pressure from within dome switch opening 402 of switch housing 400 when the dome switch is collapsed by keycap 300. PCB 500 may provide a rigid support structure for switch housing 400 and the various components forming low-travel keyboard assembly 200.

Low-travel keyboard assembly 200, as shown in FIGS. 2 and 3, may also include a keyboard shield 600 positioned below PCB 500. As discussed in detail herein, shield 600 may be formed from a number of layers or components. The embodiment shown in FIGS. 2 and 3 may only depict one layer or component of shield 600 of low-travel keyboard assembly 200. Specifically, FIGS. 2 and 3 depict an adhesive sheet 602 of shield 600. Adhesive sheet 602 may be adhered to PCB 500 opposite switch housing 400. Adhesive sheet 602 of keyboard shield 600 may be at least partially conductive; the adhesive itself may be conductive, or a conductive adhesive may be used to form certain portions of the shield 600, or conductive elements may form electrically conductive paths in or through adhesive sheet. Where a conductive adhesive is used, the adhesive itself may be electrically conductive and/or the adhesive may be doped with electrically conductive particles, either in localized regions or throughout the whole sheet. Accordingly, in some embodiments, adhesive sheet may transmit signals to and/or from keyboard assembly 200 of electronic device 100 during user interaction. The electrically conductive sheet, or portions thereof, may provide a ground path to a ground plane for certain electrical components of the keyboard. In some embodiments, the ground plane may be another part of shield 600.

Additionally, adhesive sheet 602 of shield 600 may include a venting system 604. Venting system 604 may vent air expelled from switch housing 400 when dome switch is collapsed by keycap 300, as discussed herein. As shown in FIGS. 2 and 3, venting system 604 may include a group of channels 606 formed within and/or partially through adhesive sheet 602 of shield 600. Additionally, as shown in FIG. 3, channels 606 formed in adhesive sheet 602 may be in fluid communication and/or may be substantially aligned with dome switch openings 402 formed in switch housings 400, and apertures 504 formed through PCB 500.

In some embodiments, an upper and/or lower surfaces of the channels 606 may be formed by the adjacent layers of the shield 600, and/or by layers of the keyboard assembly adjacent the shield. These upper and/or lower surfaces may be flat, stepped, or they may be curved, scalloped, indented or otherwise non-planar with the portions of such layers that do not form parts of the channels. As one non-limiting example, a surface of an intermediate layer (see, FIG. 5) adjacent to the adhesive sheet 602 may be shaped to form indentations that correspond to the locations of the channels 606 (or some of the channels) when the adhesive sheet 602 is positioned atop or otherwise adjacent to the intermediate layer. Such indentations may form a portion of the overall channel or channels 606 for venting keys. In such an embodiment, the channels 606 may extend partially or fully through the adhesive layer 602. In a similar manner, an underside of the PCB 500 (as viewed when looking down on the keyboard) may be similarly shaped to define an upper portion of a venting channel 606 or channels. It should be appreciated that the cooperation of multiple layers to form a multi-layer venting channel is but one embodiment; the following description contemplates both such an embodiment and embodiments where the channel 606 or channels are formed fully or substantially fully within the adhesive layer (which, in some embodiments, need not be conductive).

Figure 4:
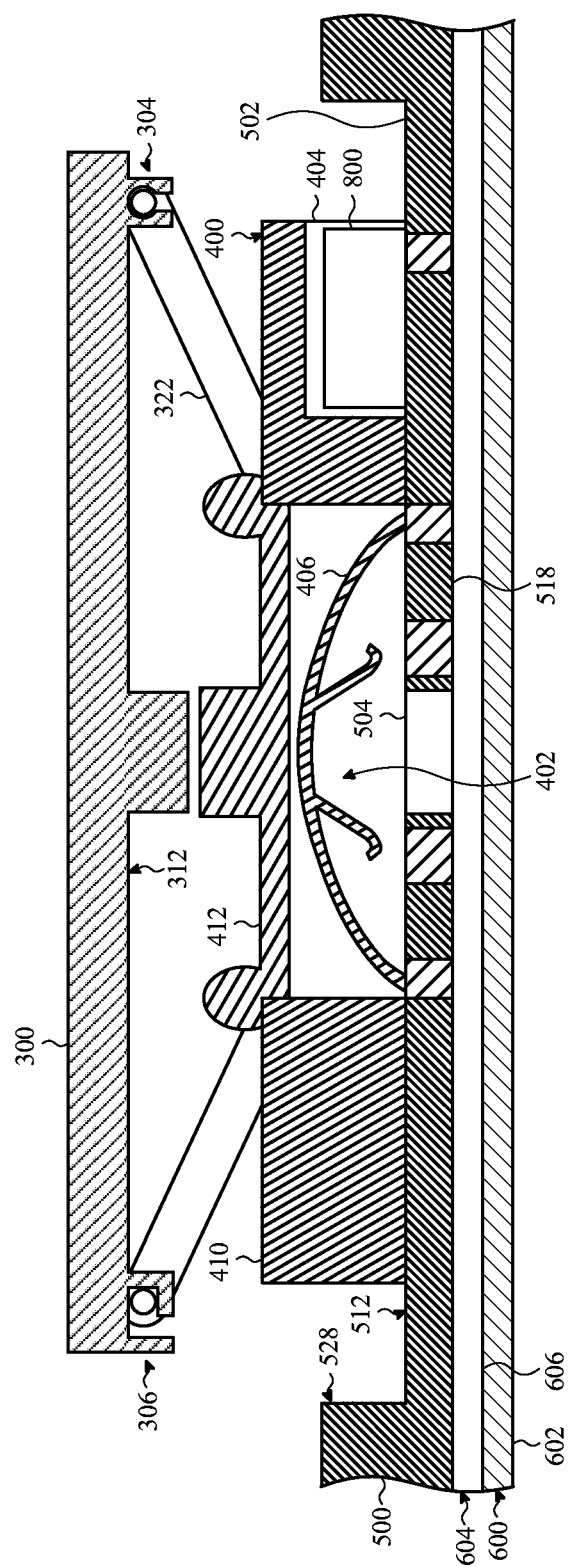
FIG. 4 shows a cross-section view of a low-travel keyboard assembly including a venting system formed within a shield, taken along line CS-CS of FIG. 3, according to embodiments.

FIG. 4 shows a cross-sectional view of a single key assembly of low-travel keyboard assembly 200 taken along line CS-CS in FIG. 3. Top case 102 of electronic device 100 is omitted from FIG. 4 for clarity. Additionally, adhesive sheet 602 of shield 600 is shown to be separated from PCB 500 of keyboard assembly 200 as a result of the line CS-CS forming cross-section of FIG. 4 being taken through a channel 606 (see, FIG. 2) of shield 600. It is understood that similarly named components or similarly numbered components may function in a substantially similar fashion, may include similar materials and/or may include similar interactions with other components. Redundant explanation of these components has been omitted for clarity.

Keycap 300 of low-travel keyboard assembly 200 may include retaining members 304, 306 positioned on keycap 300. More specifically, as shown in FIG. 4, keycap 300 may include at least one first retaining member 304 positioned on a first side of keycap 300 and at least one second retaining member 306 positioned on a second side of keycap 300, opposite the first side. Retaining members 304, 306 may be formed on an underside 312 of keycap 300 adjacent switch housing 400 of low-travel keyboard assembly 200.

The retaining members 304, 306 may be utilized to couple keycap 300 within low-travel keyboard assembly 200 and, specifically, to a hinge mechanism 322 coupled to PCB 500. Hinge mechanism 322, as shown in FIG. 4, may include any suitable hinge mechanism 322 capable of moving keycap 300 from a rest or undepressed state to a depressed state, including, but not limited to, a butterfly hinge mechanism, a scissor hinge mechanism, a telescoping hinge mechanism and a sliding hinge mechanism. Hinge mechanism 322 may be coupled to and/or positioned within recess 502 of PCB 500.

Low-travel keyboard assembly 200 may include switch housing 400 positioned between keycap 300 and PCB 500. Switch housing 400 may be positioned within recess 502 of PCB 500 and may be coupled to a first surface 512 of PCB 500, adjacent keycap 300. Additionally, as discussed herein with respect to FIGS. 2 and 3, switch housing 400 may include dome switch opening 402 formed through switch housing 400 and LED recess 404 formed through a portion of switch housing 400. As shown in FIG. 4, dome switch opening 402 may receive and/or house dome switch 406, which may be collapsed by keycap 300 to form an electrical connection to interact with electronic device 100 (see, FIG. 1). Additionally, as shown in FIG. 4, LED recess 404 of switch housing 400 may receive an LED assembly 800, which may emit a light through switch housing 400 to provide a light around the perimeter of keycap 300 and/or through transparent glyph 302 (see, FIGS. 2 and 3) formed through keycap 300.

As shown in FIG. 4, switch housing 400 may include a body portion 410 and a top panel 412 formed integrally and molded to body portion 410. Body portion 410 of switch housing 400 may include dome switch opening 402 and LED recess 404 formed adjacent dome switch opening 402. Body portion 410 may be directly coupled to PCB 500 within recess 502, as shown in FIG. 4. Top panel 412 of switch housing 400 may be formed integrally with body portion 410. More specifically, as shown in FIG. 4, top panel 412 may be molded to and formed integrally with body portion 410 and may cover switch opening 402 formed in body portion 410. In a non-limiting example, top panel 412 may be formed integrally with body portion 410 using a double-shot housing formation process. Body portion 410 provides rigid structure to protect dome switch 406, and top panel 412 provides an intermediate protective layer positioned between dome switch 406 and keycap 300, such that top panel 412 prevents wear to dome switch 406 caused by keycap 300 over the operational life of keyboard assembly 200. In some embodiments, top panel 412 may act as a light guide and thus may and disperse light from LED assembly 800 toward keycap 300 to illuminate keyboard assembly 200 as discussed herein.

As discussed herein, and shown in FIG. 4, PCB 500 may have one or more recesses 502 for receiving and/or positioning switch housing 400 and hinge mechanism 322 within recess 502. As shown in FIG. 4, recess 502 of PCB 500 may have a perimeter 528 that may substantially surround switch housing 400. Perimeter 528 of recess 502 may be larger than a perimeter of keycap 300. In a non-limiting example, the perimeter of keycap 300 may be smaller than perimeter 528 of recess 502 of PCB 500. As a result, a portion of keycap 300 may extend into recess 502 of PCB 500 when keycap 300 and/or dome switch 406 of switch housing 400 is in a partially-collapsed or fully collapsed state.

Adhesive sheet 602 of shield 600 may be coupled and/or adhered to second surface 518 of PCB 500. The portion of adhesive sheet 602 that may be coupled and/or adhered to second surface 518 of PCB 500 may include the portion of adhesive sheet 602 positioned adjacent to and/or substantially surrounding channels 606 of venting system 604. That is, the portions of adhesive sheet 602 substantially surrounding channels 606 may be coupled to second surface 518 of PCB 500 to couple adhesive sheet 602 to PCB 500 within keyboard assembly 200.

Adhesive sheet 602 of shield 600 may define or otherwise include a venting system 604 in fluid communication with switch housing 400. As shown in FIG. 4, venting system 604 may include channel 606 formed below PCB 500. More specifically, channel 606 may be formed in adhesive sheet 602 of shield 600, adjacent PCB 500. Channel 606 may be in fluid communication with aperture 504 formed in PCB 500, and dome switch opening 402 positioned above and substantially aligned with aperture 504. As discussed herein, adhesive sheet 602 (including channel 606) may be formed from a conductive, selectively permeable material that is impermeable to solids and liquids, but permeable to gases.

In some embodiments, the adhesive sheet 602 (or select parts thereof) may be both gas- and liquid-impermeable. In still other embodiments, the adhesive sheet 602 may be gas-permeable but may have a relatively moderate or low permeability, such that gases pass slowly through the sheet.

As shown in FIG. 4, air from within dome switch opening 402 of switch housing 400 may pass through channel 606 when dome switch 406 is collapsed by keycap 300. In a non-limiting example, as dome switch 406 of switch housing 400 is collapsed, air under dome switch 406 may be forced through aperture 504 of PCB into channel 606 of shield 600 to provide an exit path for air. The air flowing from under dome switch 406 in switch housing 400 may pass through channel 606 of adhesive layer 602 to other portions of low-travel keyboard assembly 200. In the non-limiting example, the air under dome switch 406 flowing into channel 606 via aperture 504 of PCB 500 may flow in either direction of channel 606, which may be in fluid communication with other channels 606 and/or other switch housings 400 of low-travel keyboard assembly 200, as discussed herein.

Figure 5:
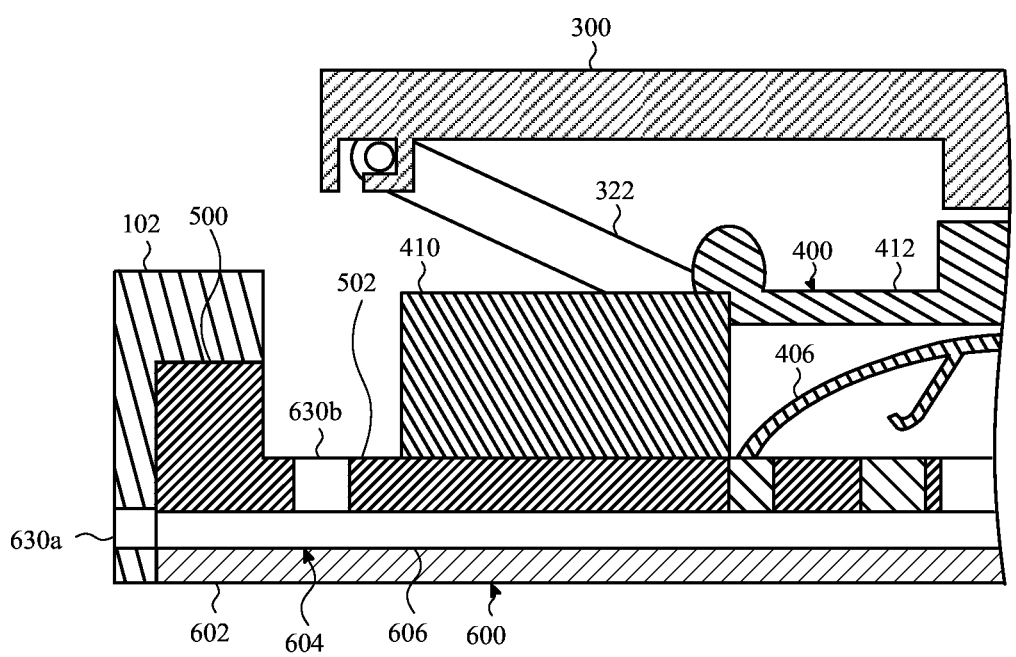
FIG. 5 shows a cross-section detailed view of a portion of a low-travel keyboard assembly including a venting system formed within a shield and a top case, taken along line CS-CS of FIG. 3, according to additional embodiments.

In response to a key press, air may flow through channel 606 and exit low-travel keyboard assembly 200. FIG. 5 shows a cross-sectional, detailed view of keyboard assembly 200 including top case 102. The detailed view of FIG. 5 only shows a portion of top case 102, keycap 300, hinge mechanism 322, switch housing 400 (including body portion 410 and top panel 412), dome switch 406, PCB 500 and shield 600. It is understood that the portions of keyboard assembly 200 not shown in FIG. 5 may be substantially similar and/or may function substantially similar to those portions previously discussed and shown in FIG. 4.

As shown, channel 606 of adhesive sheet 602 may be in fluid communication with the atmosphere or ambient air surrounding low-travel keyboard assembly 200 via an exit 630a, 630b. Exits 630a, 630b may be formed through a variety of distinct parts or components of low-travel keyboard assembly 200. In the non-limiting example shown in FIG. 5, exit 630a may be formed in top case 102 of electronic device 100, to vent air from channel 606 through top case 102. In another non-limiting example shown in FIG. 5, exit 630b may be formed through PCB 500, adjacent switch housing 400. Exit 630b may vent air from channel 606 through recess 502 and out into the atmosphere around keycap 300.

Figure 6:
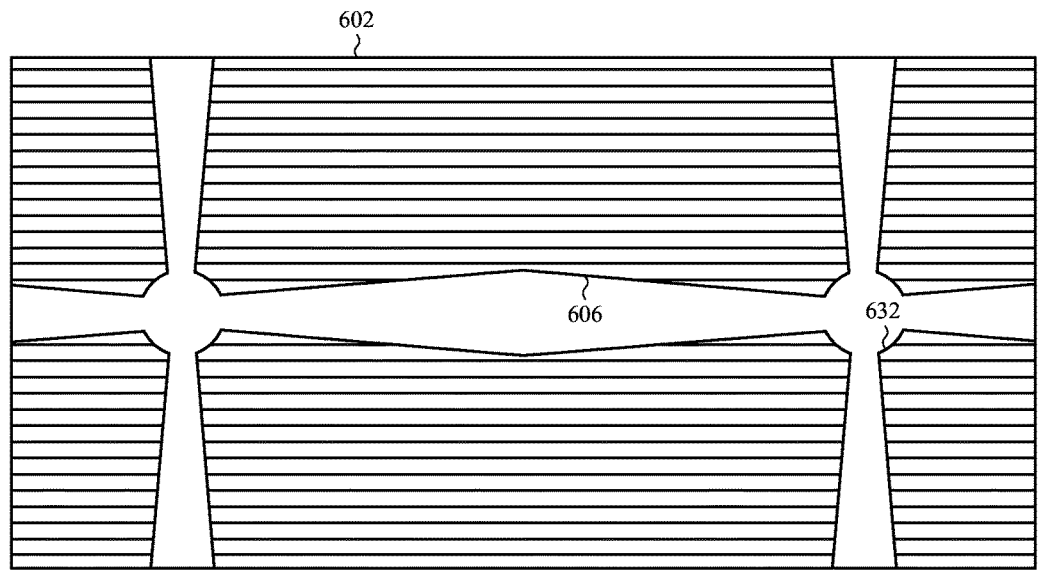
FIG. 6 shows an enlarged view of a portion of an adhesive sheet including a venting system of a shield of a low-travel keyboard assembly having linear channels, according to embodiments.
Figure 7:
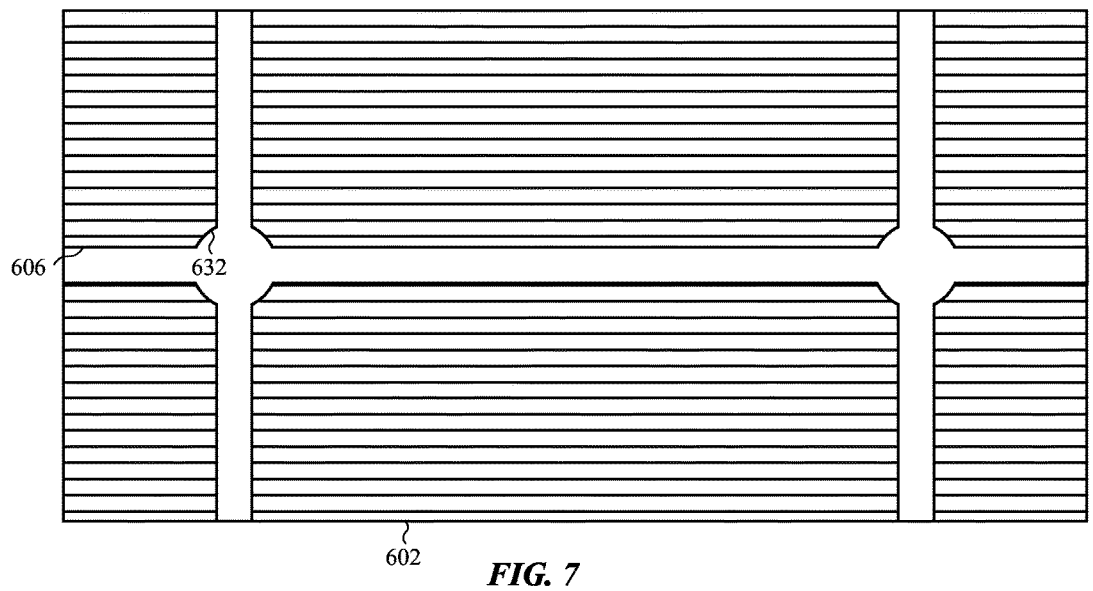
FIG. 7 shows an enlarged view of a portion of an adhesive sheet including a venting system of a shield of a low-travel keyboard assembly having tapered channels, according to additional embodiments.

Turning to FIGS. 6 and 7, a top view of a portion of adhesive sheet 602, including channel 606, is shown. More specifically, FIGS. 6 and 7 may depict how channels 606 are in fluid communication with one another. Channels 606 of venting system 604 may include substantially circular portions 632 that may be in alignment with aperture 504 formed through PCB 500 and/or dome switch opening 402 of switch housing 400 (see, FIG. 4). In a non-limiting example shown in FIG. 6, the portions of channel 606 formed between circular portions 632 may have a substantially conical shape, V-shape, diamond shape and/or varying width. In another non-limiting example shown in FIG. 7, the portions of channel 606 formed between circular portions 632 may have a uniform shape and/or uniform width.

The components (e.g., keycaps 300, switch housing 400, and so on) of low-travel keyboard assembly 200 may be arranged in distinct rows. As such, and as shown in FIGS. 8-11, venting system 604 may include channels 606, where each of the channels 606 may correspond to a distinct row of low-travel keyboard assembly 200. More specifically, each of the channels 606 of venting system 604 of shield 600 may be positioned in alignment with a distinct row of keycaps 300 (shown in phantom) of low-travel keyboard assembly 200. Each channel 606 may be in alignment with and in fluid communication with dome switch openings 402 of switch housing 400 and apertures 504 in PCB 500 in the distinct row of low-travel keyboard assembly 200, as discussed herein with respect to FIG. 4. Likewise, channels 606 may be associated with all keys in a particular column, or a group of adjacent keys, and so on.

Figure 8:
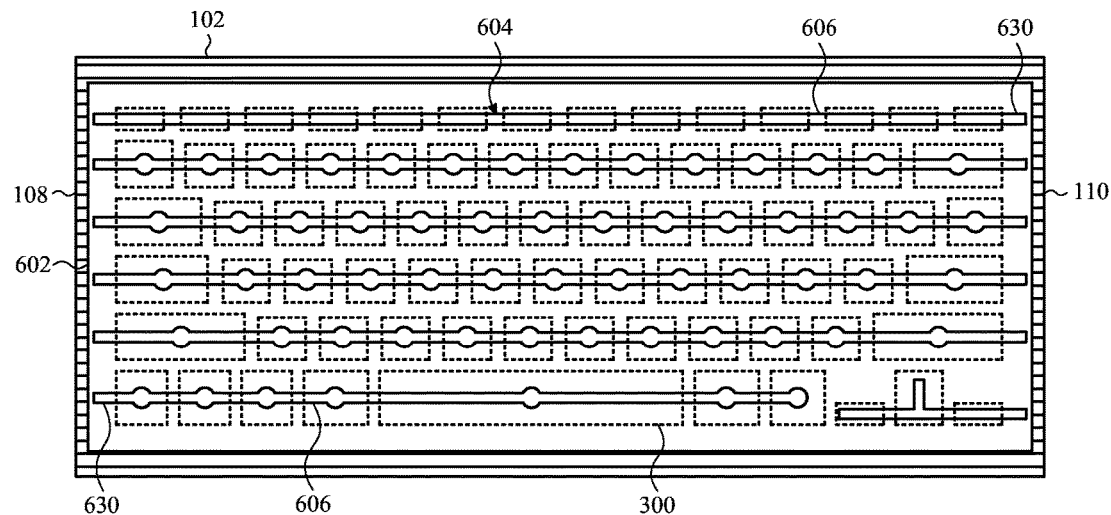
FIG. 8 shows a top view of a venting system formed within a shield of a low-travel keyboard assembly having individual channels for each row of keys and multiple exits formed on distinct sides of the channel, according to embodiments.
Figure 9:
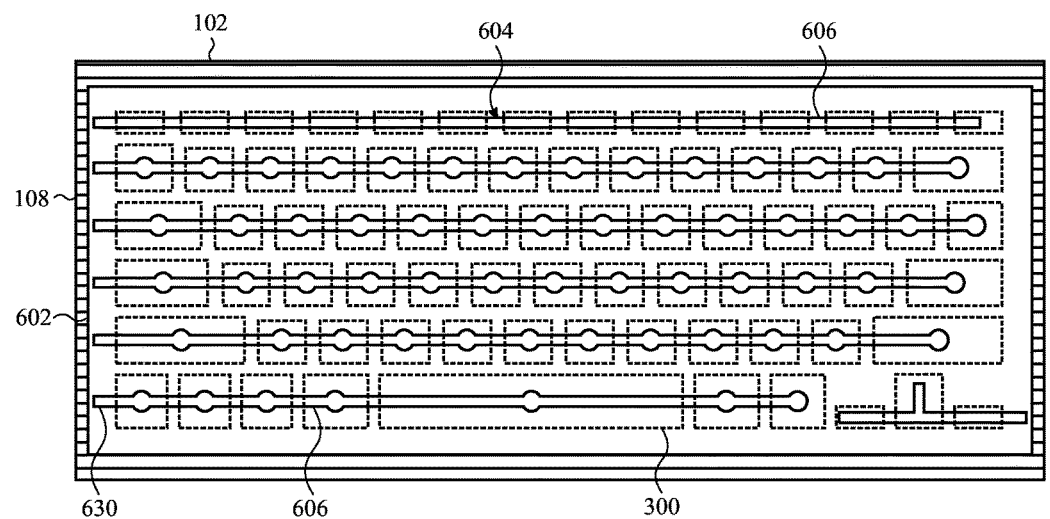
FIG. 9 shows a top view of a venting system formed within a shield of a low-travel keyboard assembly having individual channels for each row of keys and a single exit formed on a single side of each channel, according to embodiments.

As shown in FIG. 8, each distinct row of keycaps 300 of low-travel keyboard assembly 200 may include an individual channel 606 formed in adhesive sheet 602. Each channel 606 in FIG. 8 may have an exit 630 positioned adjacent either side 108, 110 of top case 102 for venting air within low-travel keyboard assembly 200 to the atmosphere on either side of top case 102. In another non-limiting embodiment, as shown in FIG. 9, each channel 606 of venting system 604 may have exit 630 positioned adjacent a single side 108 of top case 102, such that air traveling through channels 606 may only be vented to the atmosphere on a single side 108 of top case 102. Other embodiments may vary the exit's location.

Figure 10:
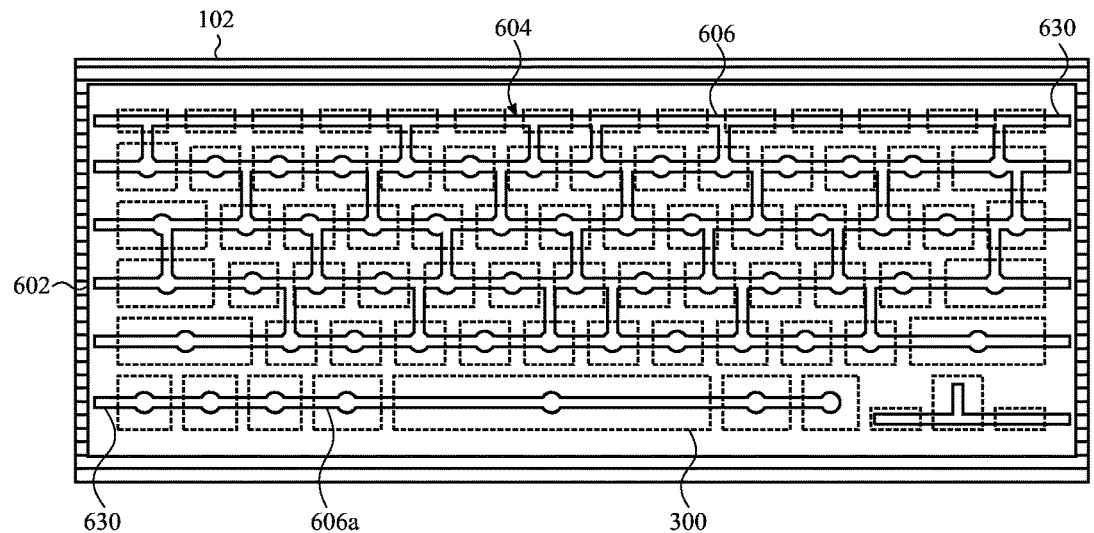
FIG. 10 shows a top view of a venting system formed within a shield of a low-travel keyboard assembly having a single channel for multiple rows of keys and multiple exits formed on distinct sides of the single channel, according to embodiments.
Figure 11:
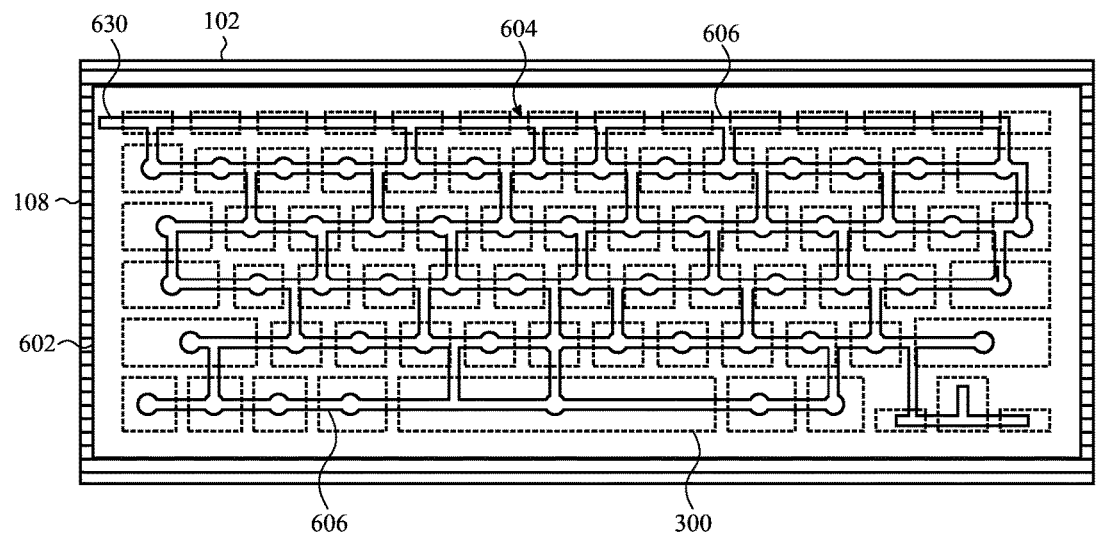
FIG. 11 shows a top view of a venting system formed within a shield of a low-travel keyboard assembly having a single channel for multiple rows of keys and a single exit formed on a single side of the single channel, according to embodiments.

FIGS. 10 and 11 depict groups of channels 606 that are in fluid communication within one another. In a non-limiting example shown in FIG. 10, all channels 606, except for the channel 606a beneath the bottom row of keycaps 300, may be in fluid communication with one another, thereby allowing air to flow between channels 606. The keycaps 300 are shown in phantom to illustrate their placement relative to the channels 606. Additionally, as shown in FIG. 10, each row of channels 606, although in fluid communication, may include individual exits 630 for venting air from channels 606 to the atmosphere. Again, this may vary between embodiments; more or fewer exits may be implemented.

In another non-limiting example shown in FIG. 11, all channels 606 of venting system 604 are in fluid communication with one another. This may allow air displaced by key travel to flow through from any individual channel 606 to adjacent channels. As shown in FIG. 11, the channels 606 may include only a single exit 630. Here, the exit is positioned on a single side 108 of top case 102. As such, the air flowing through channel 606 may only be vented to the atmosphere through the single exit 630 of venting system 604 shown in FIG. 11. As with other embodiments, more or fewer exits may be implemented and the locations of such exits may be changed.

Although venting system 604 is shown in shield 600 of low-travel keyboard assembly 200, it is understood that venting system 604a may be formed directly in switch housing 400. In a non-limiting example shown in FIG. 12, at least one passageway 634 may be formed in fluid communication with dome switch opening 402 of switch housing 400. More specifically, passageway 634 may be formed through switch housing 400 opposite LED recess 404 formed in switch housing 400. A group of passageways 634 may be positioned through switch housing 400 opposite LED recess 404. Additionally, passageways 634 may be formed through switch housing 400 adjacent LED recess 404, as shown in FIG. 12.

Figure 12:
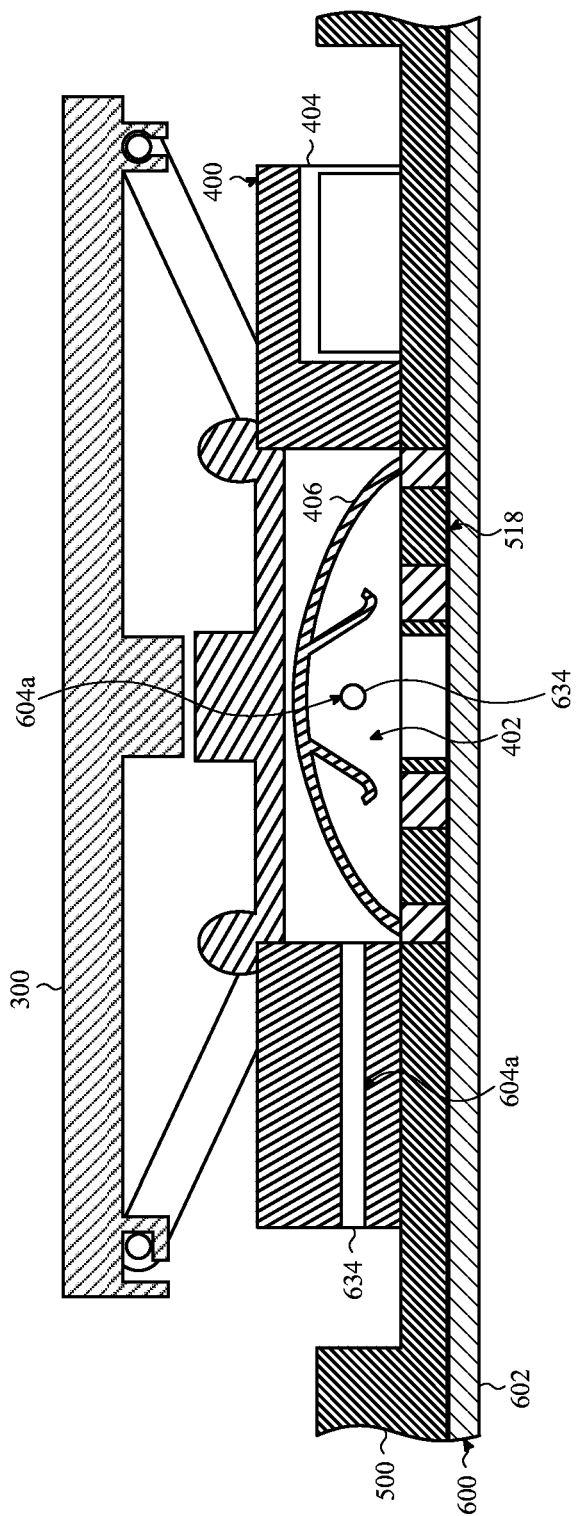
FIG. 12 shows a cross-section front view of a low-travel keyboard assembly including a venting system formed within a switch housing, according to embodiments.

As shown in FIG. 12, venting system 604a may be formed in switch housing 400, instead of (or in addition to) in shield 600. As shown, adhesive sheet 602 may be a substantially solid and adhered to second surface 518 of PCB 500. When dome switch 406 is collapsed by keycap 300, the air under dome switch 406 may be expelled through openings formed in dome switch 406 (not shown). When air is expelled from underneath dome switch 406 during collapse, the air may flow from dome switch opening 402 to the atmosphere via passageway(s) 634 formed through switch housing 400.

Figure 13:
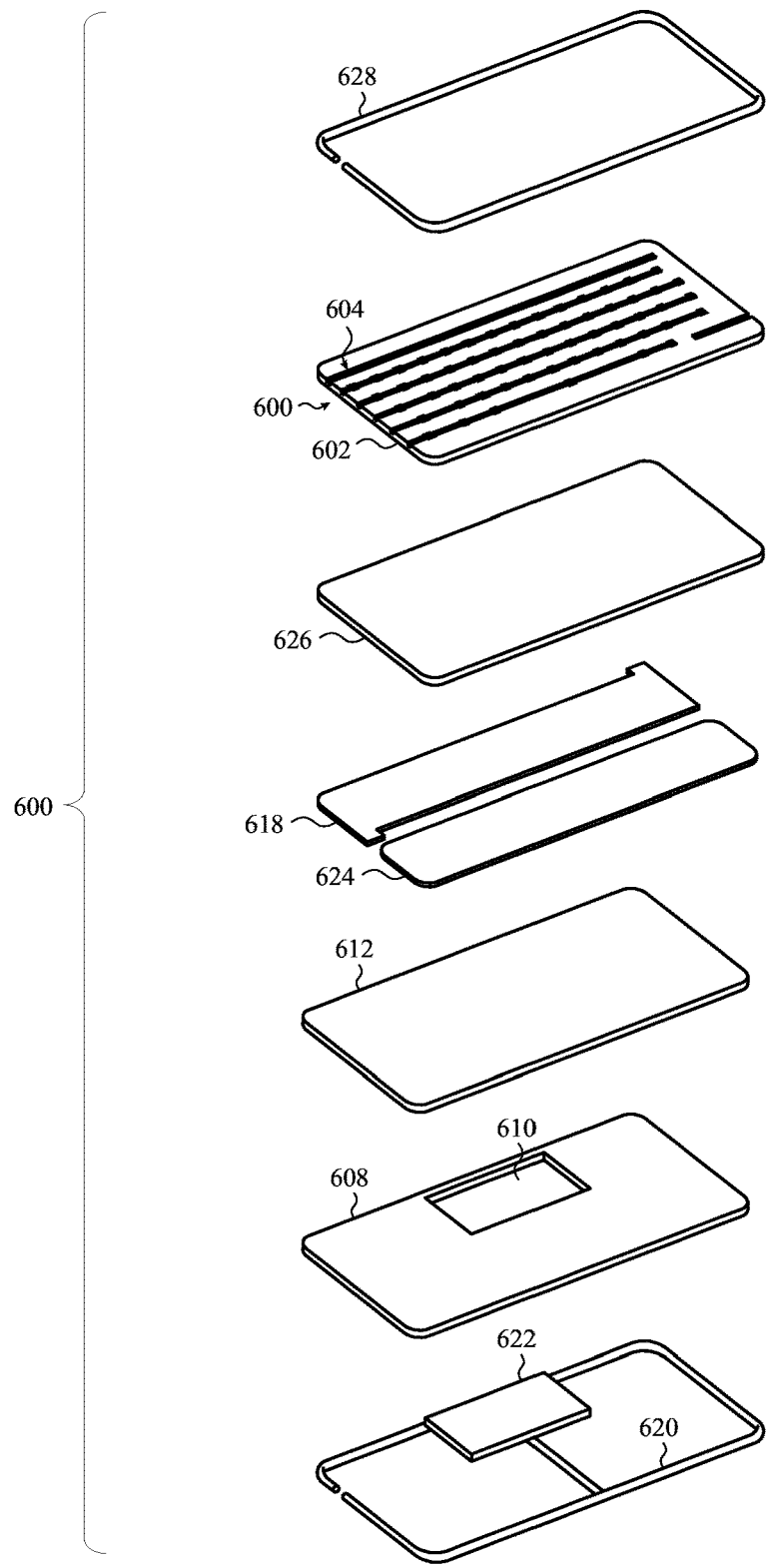
FIG. 13 shows an exploded view of a shield of a low-travel keyboard assembly, according to embodiments.

FIG. 13 depicts an exploded view of shield 600 of low-travel keyboard assembly 200. As shown in FIG. 13, shield 600 may include base layer 608. Base layer 608 may act as a bottom, supporting layer for shield 600 of low-travel keyboard assembly 200. As shown in FIG. 13, base layer 608 may have an opening 610 formed through a portion of base layer 608. As discussed herein, opening 610 may be formed through base layer 608 to electrically couple the components positioned above and below base layer 608. Base layer 608 may be formed from an electrically insulating material including, but not limited to, polyethylene terephthalate (PET).

Shield 600 may also have an aluminum layer 612 positioned over base layer 608. Aluminum layer 612 may be in electrical communication with a circuit board 618 for low-travel keyboard assembly 200. More specifically, as shown in FIG. 13, aluminum layer 612 may act as an electrical conduit for circuit board 618 positioned over aluminum layer 612. Additionally, aluminum layer 612 may provide electromagnetic interference (EMI) shielding for circuit board 618 during operation of low-travel keyboard assembly 200 in electronic device 100.

Aluminum layer 612 may act as an electrical conduit to circuit board 618 for a conductive gasket 620 of shield 600. That is, aluminum layer 612 may be in electrical communication with circuit board 618, and conductive gasket 620 may contact aluminum layer 612 to be in electrical communication with circuit board 618 as well. Conductive gasket 620 may contact aluminum layer 612 by positioning a contact portion 622 of conductive gasket 620 through opening 610 of base layer 608, where the contact portion 622 directly contacts aluminum layer 612. Conductive gasket 620 may be in electrical communication with circuit board 618 of shield 600 to provide a ground for various components, contacts and/or other electronic features of circuit board 618 within low-travel keyboard assembly 200.

Shield 600, as shown in FIG. 13, may also have a graphite layer 624 positioned over aluminum layer 612. More specifically, graphite layer 624 may be positioned over aluminum layer 612 and may be positioned adjacent circuit board 618, such that both graphite layer 624 and circuit board 618 may be positioned over aluminum layer 612. As such, circuit board 618 and graphite layer 624 may both be stacked on aluminum layer 612 and/or may be in the same plane within shield 600. Graphite layer 624 may be positioned adjacent circuit board 618 to spread heat generated and/or emitted by circuit board 618 during operation of low-travel keyboard assembly 200. In some embodiments, the aluminum layer may serve as an electrical ground for certain components of the keyboard.

An intermediate layer 626 may be positioned over graphite layer 624. More specifically, as shown in FIG. 13, circuit board 618 and graphite layer 624 may be positioned between intermediate layer 626 and aluminum layer 612 of shield 600. Similar to base layer 608 of shield 600, intermediate layer 626 may be formed from an electrically insulating material, such as polyethylene terephthalate (PET), to electrically insulate circuit board 618 and/or aluminum layer 612. More specifically, as shown in FIG. 13, intermediate layer 626 and base layer 608 may be formed from electrically insulating material to electrically insulate circuit board 618 and aluminum layer 612 positioned between base layer 608 and intermediate layer 626.

Shield 600 may further include adhesive sheet 602 including venting system 604 formed within adhesive sheet 602. As shown in FIG. 13, adhesive sheet 602 may be positioned over intermediate layer 626. As discussed in detail below, adhesive sheet 602 may be coupled to second surface 518 of PCB 500 of low-travel keyboard assembly 200 and may be in electrical communication with electrical connectors 522, 524 formed on, through, or within PCB 500 (see, FIG. 14). Adhesive sheet 602 may be formed from a material substantially impermeable to liquids and permeable to gases.

A conductive ring 628 may substantially surround adhesive layer 602. More specifically, as shown in FIG. 13, conductive ring 628 of shield 600 may be positioned substantially around a perimeter of adhesive layer 602 and may be positioned on intermediate layer 626. Like adhesive sheet 602, conductive ring 628 may also be coupled to second surface 518 of PCB 500 of low-travel keyboard assembly 200 and may be in electrical communication with electrical connectors 522, 524 of PCB 500 to ground components of low-travel keyboard assembly 200.

Although not shown in FIG. 13, it is understood that the components of the shield 600 may include electrical vias and/or electrical traces for electrically coupling the various layers and components of shield 600. That is, electrical vias and/or electrical traces may be formed on or through adhesive sheet 602 and intermediate layer 626 to electrically couple adhesive sheet 602 to circuit board 618. The electrical vias and/or electrical traces formed within shield 600 may allow an electrical signal to be sent from PCB 500 to circuit board 618, when dome switch 406 is collapsed to contact electrical connectors 522, 524 of PCB 500 (see, FIG. 14).

Figure 14:
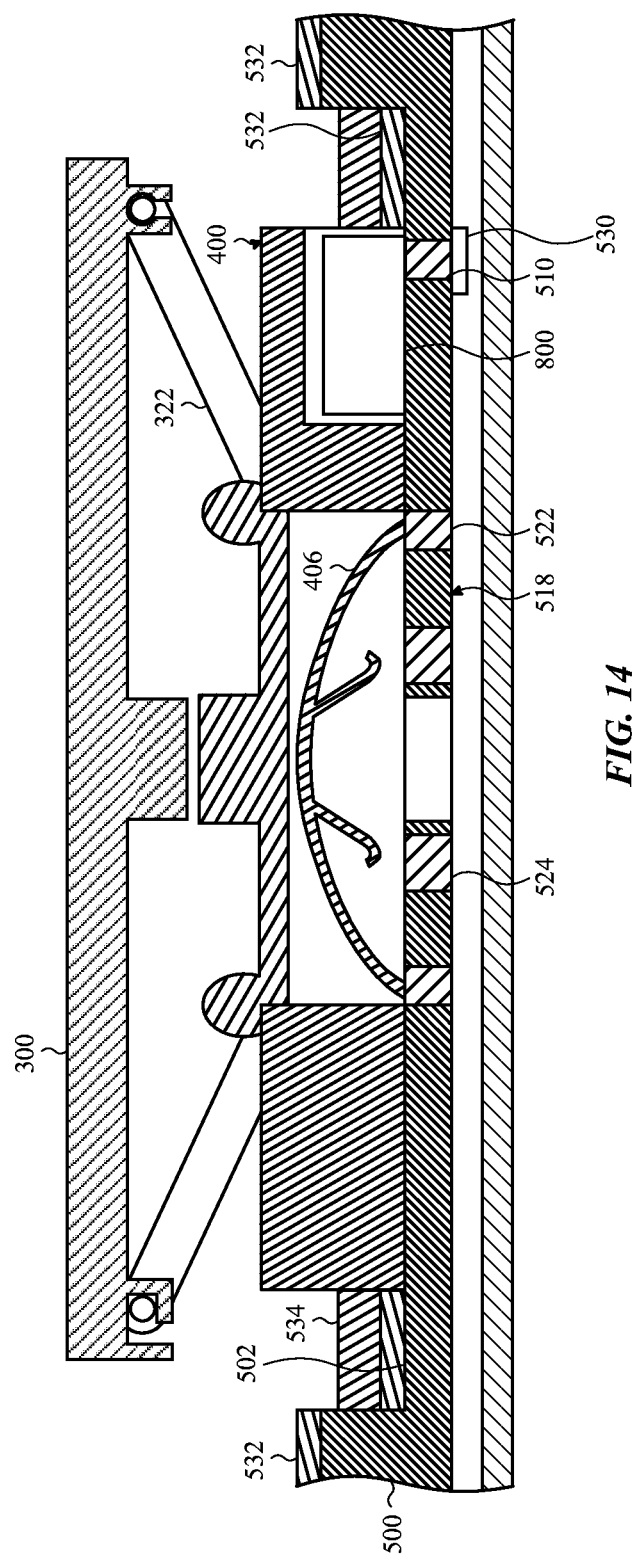
FIG. 14 shows a cross-section view of a low-travel keyboard assembly including a plating layer and an encapsulating layer, taken along line CS-CS of FIG. 3, according to embodiments.

As shown in FIG. 14, LED assembly 800 may be in electrical contact with LED contact 510 formed through PCB 500. As shown in FIG. 14, LED contact 510 may be in communication with an LED driver 530 positioned on second surface 518 of PCB 500. In the non-limiting example, PCB 500 may have a number of LED drivers 530 positioned on second surface 518, where each LED driver 530 corresponds to, and is in electrical communication with, LED assembly 800 of low-travel keyboard assembly 200. LED contact 510 and LED drivers 530 may be formed adjacent and/or approximate electrical connectors or contacts 522, 524 of PCB 500, which are configured to provide an electrical signal to electronic device 100 when dome switch 406 is collapsed by keycap 300, as discussed herein. LED drivers 530 positioned on second surface 518 of PCB 500 may be configured to provide power and/or control to LED assembly 800 during operation of low-travel keyboard assembly 200 included in electronic device 100 (see, FIG. 1).

PCB 500, as discussed herein with respect to FIGS. 2-4, may also have a plated layer 532. As shown in FIG. 14, plated layer 532 may be formed over first surface 512 (see, FIG. 4) of PCB 500. More specifically, plated layer 532 may be formed over a portion of first surface 512 of PCB within recess 502 and/or over a surface of PCB 500 substantially surrounding recess 502. Plated layer 532 may be formed from any metal material that may substantially protect first surface 512 of PCB 500 from undesirable wear or damage during the operational life of low-travel keyboard assembly 200.

As shown in FIG. 14, PCB 500 may also have an encapsulating layer 534 covering first surface 512 (see, FIG. 4) of recess 502 of PCB 500 and/or a portion of switch housing 400 positioned within recess 502. That is, encapsulating layer 534 may be formed within recess 502 and may substantially cover first surface 512 and at least a portion of the various components (e.g., switch housing 400, hinge mechanism 322) of low-travel keyboard assembly 200 to maintain the position of the components within recess 502. Specifically, encapsulating layer 534 may maintain the coupling between switch housing 400 and PCB 500. Encapsulating layer 534 may be formed from any suitable transparent, bonding material that may not affect the illumination features and/or electrical connections of low-travel keyboard assembly 200.

Although shown in FIG. 14 as including both plated layer 532 and encapsulating layer 534, it is understood that PCB 500 may include only plated layer 532 or encapsulating layer 534. That is, PCB 500 may have only plated layer 532, only encapsulating layer 534 or both plated layer 532, and encapsulating layer 534, as shown in FIG. 14.

In addition to the various channels, vents, and venting systems shown herein, it should be understood that other embodiments may include additional features. For example, some embodiments may include one or more reservoirs connected to one or more venting channels and/or exits. A group of keys may be connected by a channel to an exit, as described above; the channel may have a reservoir positioned at some point along its length between the exit and one or more of the group of keys. The reservoir may permit air or other gases to flow in and out of the reservoir instead of requiring the air to be forced all the way to the exit or drawn all the way from the exit. Such reservoirs are entirely optional and may be used with any or all keys, key groups, and/or other structures (including switches, switch housings, and the like) discussed herein.

Although discussed herein as a keyboard assembly, it is understood that the disclosed embodiments may be used in a variety of input devices associated with various electronic devices. That is, low-travel keyboard assembly 200 and the components of the assembly discussed herein may be utilized or implemented in a variety of input devices for an electronic device including, but not limited to, mice, track pads, buttons, switches, toggles, wheels, touch- and/or force-sensitive surfaces, and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A keyboard assembly, comprising:
    a set of keycaps arranged along a row extending across a width of the keyboard assembly;
    a printed circuit board positioned below the set of keycaps and defining a set of apertures, each aperture of the set of apertures aligned with a corresponding one of the set of keycaps;
    a group of switch housings coupled to the printed circuit board, each switch housing of the group of switch housings defining a switch opening positioned above one of the set of apertures of the printed circuit board; and
    a shield defining a channel formed below the printed circuit board along the row, the channel in fluid communication with each aperture of the set of apertures, the channel comprising an exit in fluid communication with atmosphere external to the set of keycaps.

2. The keyboard assembly of claim 1, wherein the shield comprises an adhesive sheet coupled to the printed circuit board.

3. The keyboard assembly of claim 2, wherein the channel of the venting system is formed in the adhesive sheet.

4. The keyboard assembly of claim 3, wherein the adhesive sheet is formed from a gas-permeable material.

5. The keyboard assembly of claim 4, further comprising a reservoir connected to the channel and formed in the adhesive sheet.

6. The keyboard assembly of claim 4, wherein the selectively permeable material is permeable to gas and impermeable to solids.

7. The keyboard assembly of claim 3, wherein the shield is at least partially electrically conductive.

8. The keyboard assembly of claim 1, wherein:
    the row is a first row;
    the channel is a first channel;
    the set of keycaps is a first set of keycaps;
    the keyboard assembly further comprises a second set of keycaps arranged along a second row; and
    the shield defines a second channel formed below the printed circuit board along the second row.

9. The keyboard assembly of claim 8, wherein the first channel and the second channel are in fluid communication with one another.

10. A keyboard assembly, comprising:
    a group of keys arranged along a row of a keyboard, each key comprising:
        a keycap;
        a dome switch positioned below the keycap;
        a support structure movably supporting the keycap to the dome switch;
        a switch housing surrounding the dome switch;
    a substrate having a top surface that defines a group of recesses, each recess defining a hole and a mounting surface attached to a respective switch housing; and
    a shield beneath the substrate and defining a venting system in fluid communication with the group of keys.

11. The keyboard assembly of claim 10, wherein:
the substrate comprises a circuit board; and
the circuit board comprises a plated layer over the recesses and the surface.

12. The keyboard assembly of claim 10, wherein the shield electromagnetically shields the circuit board from electrical noise.

13. A keyboard assembly, comprising:
an input surface; and
a shield positioned below the input surface and comprising:
a base layer;
an aluminum layer positioned over the base layer;
a graphite layer positioned over the aluminum layer;
an intermediate layer positioned over the graphite layer;
an adhesive sheet positioned over the intermediate layer and defining a venting system below the input surface; and
a conductive ring substantially surrounding the adhesive sheet.

14. The keyboard assembly of claim 13, wherein the conductive ring is in contact with the intermediate layer.

15. The keyboard assembly of claim 13, wherein the base layer is formed from an electrically insulating material.

16. The keyboard assembly of claim 13, wherein the intermediate layer is formed from an electrically insulating material.

17. The keyboard assembly of claim 13, further comprising a circuit board positioned between the aluminum layer and the intermediate layer.

18. The keyboard assembly of claim 17, wherein the graphite layer is positioned adjacent the circuit board and conducts heat generated by the circuit board.

19. The keyboard assembly of claim 17, further comprising a conductive gasket formed below the base layer, and in electrical communication with the circuit board.

20. The keyboard assembly of claim 17, wherein the aluminum layer is configured as an electromagnetic interference shield.

21. The keyboard assembly of claim 17, wherein the adhesive sheet is in electrical communication with one or more electrical connectors formed within the printed circuit board, each of the electrical connectors corresponding to a key assembly of the keyboard assembly.

22. The keyboard assembly of claim 1, wherein the channel is configured to evacuate fluid from the multiple switch openings aligned along the row of apertures from the keyboard assembly using an exit formed along an exterior surface of the keyboard assembly.

23. The keyboard assembly of claim 10, wherein:
the group of keycaps are arranged in a row extending from a first end of the keyboard assembly to a second, opposite end of the keyboard assembly; and
the shield defines a channel extending from the recesses and extending along the row.

24. The keyboard assembly of claim 10, wherein the channel is configured to transfer fluid from a first switch housing of the group of switch housing to a second switch housing of the group of switch housings when a keycap of the group of keycaps positioned above the first switch housing is depressed.

25. A keyboard assembly, comprising:
a first set of keycaps arranged along a first row extending across a width of the keyboard assembly;
a second set of keycaps arranged along a second row;
a printed circuit board positioned below the first set of keycaps and defining a set of apertures, each aperture of the set of apertures aligned with a corresponding one of the first set of keycaps;
a group of switch housings coupled to the printed circuit board, each switch housing of the group of switch housings defining a switch opening positioned above one of the set of apertures of the printed circuit board;
a shield defining a first channel formed below the printed circuit board along the first row, the first channel in fluid communication with each aperture of the set of apertures, wherein the shield defines a second channel formed below the printed circuit board along the second row, wherein the first channel and the second channel are in fluid communication with one another.

26. A keyboard assembly, comprising:
a set of keycaps arranged along a row extending across a width of the keyboard assembly;
a printed circuit board positioned below the set of keycaps and defining a set of apertures, each aperture of the set of apertures aligned with a corresponding one of the set of keycaps;
a group of switch housings coupled to the printed circuit board, each switch housing of the group of switch housings defining a switch opening positioned above one of the set of apertures of the printed circuit board; and
a shield defining a channel formed below the printed circuit board along the row, the channel in fluid communication with each aperture of the set of apertures;
wherein the channel is configured to evacuate fluid from the multiple switch openings aligned along the row of apertures from the keyboard assembly using an exit formed along an exterior surface of the keyboard assembly.

* * * * *